United States Patent
Jo

(10) Patent No.: US 9,601,692 B1
(45) Date of Patent: *Mar. 21, 2017

(54) HETERO-SWITCHING LAYER IN A RRAM DEVICE AND METHOD

(71) Applicant: Crossbar, Inc., Santa Clara, CA (US)

(72) Inventor: Sung Hyun Jo, Sunnyvale, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/611,022

(22) Filed: Jan. 30, 2015

Related U.S. Application Data

(60) Continuation-in-part of application No. 13/920,021, filed on Jun. 17, 2013, now Pat. No. 8,947,908, which
(Continued)

(51) Int. Cl.
*G11C 11/00* (2006.01)
*H01L 45/00* (2006.01)
(Continued)

(52) U.S. Cl.
CPC ........ *H01L 45/1253* (2013.01); *G11C 13/004* (2013.01); *H01L 45/142* (2013.01);
(Continued)

(58) Field of Classification Search
CPC . H01L 27/2472; G11C 13/0007; G11C 5/025; G11C 13/0004; G11C 11/5678; G11C 5/06; G11C 5/02
(Continued)

(56) References Cited

U.S. PATENT DOCUMENTS

| 680,652 A | 8/1901 | Elden |
|---|---|---|
| 4,433,468 A | 2/1984 | Kawamata |

(Continued)

FOREIGN PATENT DOCUMENTS

| CN | 101131872 A | 2/2008 |
|---|---|---|
| CN | 101170132 | 4/2008 |

(Continued)

OTHER PUBLICATIONS

Jian Hu et al., "Area-Dependent Switching in Thin Film-Silicon Devices", Materials Research Society, Mal. Res. Soc. Symp Proc., 2003, pp. A18.3.1-A18.3.6, vol. 762.
(Continued)

*Primary Examiner* — David Lam
(74) *Attorney, Agent, or Firm* — Amin, Turocy & Watson, LLP

(57) ABSTRACT

A semiconductor device includes first electrodes disposed upon a substrate, wherein each first electrode comprises a metal containing material, switching devices disposed overlying the first electrodes, wherein each switching device comprises a first switching material, a second switching material, and an active metal, wherein the first switching material is disposed overlying and contacting the first electrodes, wherein the second switching material is disposed overlying and contacting the first switching material, wherein the active metal is disposed overlying and contacting the second switching material, wherein the first switching material is characterized by a first switching voltage, wherein the second switching material is characterized by a second switching voltage greater than the first switching voltage; and second electrodes disposed above the switching devices, comprising the metal material, and wherein each of the second electrodes is electrically coupled to the active metal material of the switching devices.

21 Claims, 11 Drawing Sheets

Related U.S. Application Data is a continuation-in-part of application No. 13/290,024, filed on Nov. 4, 2011, now Pat. No. 8,467,227, said application No. 13/920,021 is a continuation-in-part of application No. 13/585,759, filed on Aug. 14, 2012, now Pat. No. 8,569,172, application No. 14/611,022, which is a continuation-in-part of application No. 12/835,704, filed on Jul. 13, 2010, now Pat. No. 9,012,307, and a continuation-in-part of application No. 14/509,967, filed on Oct. 8, 2014, which is a continuation of application No. 12/861,432, filed on Aug. 23, 2010, now Pat. No. 8,884,261, application No. 14/611,022, which is a continuation-in-part of application No. 14/573,817, filed on Dec. 17, 2014, which is a division of application No. 13/462,653, filed on May 2, 2012, now Pat. No. 8,946,046.

(60) Provisional application No. 61/410,035, filed on Nov. 4, 2010, provisional application No. 61/712,171, filed on Oct. 10, 2012, provisional application No. 61/786,100, filed on Mar. 14, 2013.

(51) Int. Cl.
  *G11C 13/00* (2006.01)
  *G11C 11/56* (2006.01)

(52) U.S. Cl.
  CPC .......... *H01L 45/143* (2013.01); *H01L 45/144* (2013.01); *H01L 45/146* (2013.01); *G11C 11/5678* (2013.01); *G11C 13/0007* (2013.01)

(58) Field of Classification Search
  USPC ... 365/148, 158, 51, 171, 163, 173; 257/1–4
  See application file for complete search history.

(56) References Cited

U.S. PATENT DOCUMENTS

| | | |
|---|---|---|
| 4,684,972 A | 8/1987 | Owen et al. |
| 4,741,601 A | 5/1988 | Saito |
| 4,994,866 A | 2/1991 | Awano |
| 5,139,911 A | 8/1992 | Yagi et al. |
| 5,242,855 A | 9/1993 | Oguro |
| 5,278,085 A | 1/1994 | Maddox, III et al. |
| 5,315,131 A | 5/1994 | Kishimoto et al. |
| 5,335,219 A | 8/1994 | Ovshinsky et al. |
| 5,360,981 A | 11/1994 | Owen et al. |
| 5,457,649 A | 10/1995 | Eichman et al. |
| 5,499,208 A | 3/1996 | Shoji |
| 5,538,564 A | 7/1996 | Kaschmitter |
| 5,541,869 A | 7/1996 | Rose et al. |
| 5,594,363 A | 1/1997 | Freeman et al. |
| 5,596,214 A | 1/1997 | Endo |
| 5,614,756 A | 3/1997 | Forouhi et al. |
| 5,627,451 A | 5/1997 | Takeda |
| 5,645,628 A | 7/1997 | Endo et al. |
| 5,673,223 A | 9/1997 | Park |
| 5,707,487 A | 1/1998 | Hori et al. |
| 5,714,416 A | 2/1998 | Eichman et al. |
| 5,751,012 A | 5/1998 | Wolstenholme et al. |
| 5,763,898 A | 6/1998 | Forouhi et al. |
| 5,840,608 A | 11/1998 | Chang |
| 5,923,587 A | 7/1999 | Choi |
| 5,970,332 A | 10/1999 | Pruijmboom et al. |
| 5,973,335 A | 10/1999 | Shannon |
| 5,998,244 A | 12/1999 | Wolstenholme et al. |
| 6,002,268 A | 12/1999 | Sasaki et al. |
| 6,037,204 A | 3/2000 | Chang et al. |
| 6,122,318 A | 9/2000 | Yamaguchi et al. |
| 6,128,214 A | 10/2000 | Kuekes et al. |
| 6,143,642 A | 11/2000 | Sur, Jr. et al. |
| 6,180,998 B1 | 1/2001 | Crafts |
| 6,181,587 B1 | 1/2001 | Kuramoto et al. |
| 6,181,597 B1 | 1/2001 | Nachumovsky |
| 6,259,116 B1 | 7/2001 | Shannon |
| 6,288,435 B1 | 9/2001 | Mei et al. |
| 6,291,836 B1 | 9/2001 | Kramer et al. |
| 6,436,765 B1 | 8/2002 | Liou et al. |
| 6,436,818 B1 | 8/2002 | Hu et al. |
| 6,492,694 B2 | 12/2002 | Noble et al. |
| 6,552,932 B1 | 4/2003 | Cernea |
| 6,627,530 B2 | 9/2003 | Li et al. |
| 6,724,186 B2 | 4/2004 | Jordil |
| 6,731,535 B1 | 5/2004 | Ooishi et al. |
| 6,740,921 B2 | 5/2004 | Matsuoka et al. |
| 6,762,474 B1 | 7/2004 | Mills, Jr. |
| 6,768,157 B2 | 7/2004 | Krieger et al. |
| 6,815,286 B2 | 11/2004 | Krieger et al. |
| 6,816,405 B1 | 11/2004 | Lu et al. |
| 6,821,879 B2 | 11/2004 | Wong |
| 6,838,720 B2 | 1/2005 | Krieger et al. |
| 6,848,012 B2 | 1/2005 | LeBlanc et al. |
| 6,849,891 B1 | 2/2005 | Hsu et al. |
| 6,858,481 B2 | 2/2005 | Krieger et al. |
| 6,858,482 B2 | 2/2005 | Gilton |
| 6,864,127 B2 | 3/2005 | Yamazaki et al. |
| 6,864,522 B2 | 3/2005 | Krieger et al. |
| 6,867,618 B2 | 3/2005 | Li et al. |
| 6,881,994 B2 | 4/2005 | Lee et al. |
| 6,897,519 B1 | 5/2005 | Dosluoglu |
| 6,927,430 B2 | 8/2005 | Hsu |
| 6,939,787 B2 | 9/2005 | Ohtake et al. |
| 6,946,719 B2 | 9/2005 | Petti et al. |
| 7,020,006 B2 | 3/2006 | Chevallier et al. |
| 7,023,093 B2 | 4/2006 | Canaperi et al. |
| 7,026,702 B2 | 4/2006 | Krieger et al. |
| 7,087,454 B2 | 8/2006 | Campbell et al. |
| 7,102,150 B2 | 9/2006 | Harshfield et al. |
| 7,122,853 B1 | 10/2006 | Gaun et al. |
| 7,167,387 B2 | 1/2007 | Sugita et al. |
| 7,187,577 B1 | 3/2007 | Wang et al. |
| 7,221,599 B1 | 5/2007 | Gaun et al. |
| 7,238,607 B2 | 7/2007 | Dunton et al. |
| 7,238,994 B2 | 7/2007 | Chen et al. |
| 7,251,152 B2 | 7/2007 | Roehr |
| 7,254,053 B2 | 8/2007 | Krieger et al. |
| 7,274,587 B2 | 9/2007 | Yasuda |
| 7,289,353 B2 | 10/2007 | Spitzer et al. |
| 7,324,363 B2 | 1/2008 | Kerns et al. |
| 7,345,907 B2 | 3/2008 | Scheuerlein |
| 7,365,411 B2 | 4/2008 | Campbell |
| 7,405,418 B2 | 7/2008 | Happ et al. |
| 7,426,128 B2 | 9/2008 | Scheuerlein |
| 7,433,253 B2 | 10/2008 | Gogl et al. |
| 7,474,000 B2 | 1/2009 | Scheuerlein et al. |
| 7,479,650 B2 | 1/2009 | Gilton |
| 7,499,355 B2 | 3/2009 | Scheuerlein et al. |
| 7,515,454 B2 | 4/2009 | Symanczyk |
| 7,521,705 B2 | 4/2009 | Liu |
| 7,534,625 B2 | 5/2009 | Karpov et al. |
| 7,541,252 B2 | 6/2009 | Eun et al. |
| 7,550,380 B2 | 6/2009 | Elkins et al. |
| 7,561,461 B2 | 7/2009 | Nagai et al. |
| 7,566,643 B2 | 7/2009 | Czubatyi et al. |
| 7,606,059 B2 | 10/2009 | Toda |
| 7,615,439 B1 | 11/2009 | Schricker et al. |
| 7,629,198 B2 | 12/2009 | Kumar et al. |
| 7,667,442 B2 | 2/2010 | Itoh |
| 7,692,959 B2 | 4/2010 | Krusin-Elbaum et al. |
| 7,704,788 B2 | 4/2010 | Youn et al. |
| 7,719,001 B2 | 5/2010 | Nomura et al. |
| 7,728,318 B2 | 6/2010 | Raghuram et al. |
| 7,729,158 B2 | 6/2010 | Toda et al. |
| 7,746,601 B2 | 6/2010 | Sugiyama et al. |
| 7,746,696 B1 | 6/2010 | Paak |
| 7,749,805 B2 | 7/2010 | Pinnow et al. |
| 7,764,536 B2 | 7/2010 | Luo et al. |
| 7,772,581 B2 | 8/2010 | Lung |
| 7,776,682 B1 | 8/2010 | Nickel et al. |
| 7,778,063 B2 | 8/2010 | Brubaker et al. |
| 7,786,464 B2 | 8/2010 | Nirschl et al. |

(56) References Cited

U.S. PATENT DOCUMENTS

| | | |
|---|---|---|
| 7,786,589 B2 | 8/2010 | Matsunaga et al. |
| 7,791,060 B2 | 9/2010 | Aochi et al. |
| 7,824,956 B2 | 11/2010 | Schricker et al. |
| 7,829,875 B2 | 11/2010 | Scheuerlein |
| 7,830,698 B2 | 11/2010 | Chen et al. |
| 7,835,170 B2 | 11/2010 | Bertin et al. |
| 7,858,468 B2 | 12/2010 | Liu et al. |
| 7,859,884 B2 | 12/2010 | Scheuerlein |
| 7,869,253 B2 | 1/2011 | Liaw et al. |
| 7,875,871 B2 | 1/2011 | Kumar et al. |
| 7,881,097 B2 | 2/2011 | Hosomi et al. |
| 7,883,964 B2 | 2/2011 | Goda et al. |
| 7,897,953 B2 | 3/2011 | Liu |
| 7,898,838 B2 | 3/2011 | Chen et al. |
| 7,920,412 B2 | 4/2011 | Hosotani et al. |
| 7,924,138 B2 | 4/2011 | Kinoshita et al. |
| 7,927,472 B2 | 4/2011 | Takahashi et al. |
| 7,968,419 B2 | 6/2011 | Li et al. |
| 7,972,897 B2 | 7/2011 | Kumar et al. |
| 7,984,776 B2 | 7/2011 | Beyer et al. |
| 8,004,882 B2 | 8/2011 | Katti et al. |
| 8,018,760 B2 | 9/2011 | Muraoka et al. |
| 8,021,897 B2 | 9/2011 | Sills et al. |
| 8,045,364 B2 | 10/2011 | Schloss et al. |
| 8,054,674 B2 | 11/2011 | Tamai et al. |
| 8,054,679 B2 | 11/2011 | Nakai et al. |
| 8,067,815 B2 | 11/2011 | Chien et al. |
| 8,071,972 B2 | 12/2011 | Lu et al. |
| 8,084,830 B2 | 12/2011 | Kanno et al. |
| 8,088,688 B1 | 1/2012 | Herner |
| 8,097,874 B2 | 1/2012 | Venkatasamy et al. |
| 8,102,018 B2 | 1/2012 | Bertin et al. |
| 8,102,698 B2 | 1/2012 | Scheuerlein |
| 8,143,092 B2 | 3/2012 | Kumar et al. |
| 8,144,498 B2 | 3/2012 | Kumar et al. |
| 8,164,948 B2 | 4/2012 | Katti et al. |
| 8,168,506 B2 | 5/2012 | Herner |
| 8,183,553 B2 | 5/2012 | Phatak et al. |
| 8,187,945 B2 | 5/2012 | Herner |
| 8,198,144 B2 | 6/2012 | Herner |
| 8,207,064 B2 | 6/2012 | Bandyopadhyay et al. |
| 8,227,787 B2 | 7/2012 | Kumar et al. |
| 8,231,998 B2 | 7/2012 | Albano et al. |
| 8,233,308 B2 | 7/2012 | Schricker et al. |
| 8,237,146 B2 | 8/2012 | Kreupl et al. |
| 8,243,542 B2 | 8/2012 | Bae et al. |
| 8,258,020 B2 | 9/2012 | Herner |
| 8,265,136 B2 | 9/2012 | Hong et al. |
| 8,274,130 B2 | 9/2012 | Mihnea et al. |
| 8,274,812 B2 | 9/2012 | Jo et al. |
| 8,305,793 B2 * | 11/2012 | Majewski et al. ............ 365/148 |
| 8,315,079 B2 | 11/2012 | Kuo et al. |
| 8,320,160 B2 | 11/2012 | Nazarian |
| 8,351,241 B2 * | 1/2013 | Lu et al. ............ G11C 13/0007 |
| | | 365/148 |
| 8,369,129 B2 | 2/2013 | Fujita et al. |
| 8,369,139 B2 | 2/2013 | Liu et al. |
| 8,374,018 B2 | 2/2013 | Lu |
| 8,385,100 B2 | 2/2013 | Kau et al. |
| 8,389,971 B2 | 3/2013 | Chen et al. |
| 8,394,670 B2 | 3/2013 | Herner |
| 8,399,307 B2 | 3/2013 | Herner |
| 8,441,835 B2 | 5/2013 | Jo et al. |
| 8,456,892 B2 | 6/2013 | Yasuda |
| 8,466,005 B2 | 6/2013 | Pramanik et al. |
| 8,467,226 B2 * | 6/2013 | Bedeschi et al. ............ 365/148 |
| 8,467,227 B1 * | 6/2013 | Jo ............ 365/148 |
| 8,502,185 B2 | 8/2013 | Lu et al. |
| 8,569,104 B2 | 10/2013 | Pham et al. |
| 8,587,989 B2 | 11/2013 | Manning et al. |
| 8,619,459 B1 | 12/2013 | Nguyen et al. |
| 8,658,476 B1 | 2/2014 | Sun et al. |
| 8,659,003 B2 | 2/2014 | Herner et al. |
| 8,675,384 B2 | 3/2014 | Kuo et al. |
| 8,693,241 B2 | 4/2014 | Kim et al. |
| 8,853,759 B2 | 10/2014 | Lee et al. |
| 8,854,859 B2 | 10/2014 | Chung |
| 8,934,294 B2 | 1/2015 | Kim et al. |
| 8,946,667 B1 | 2/2015 | Clark et al. |
| 8,946,673 B1 | 2/2015 | Kumar |
| 8,947,908 B2 * | 2/2015 | Jo ............ 365/148 |
| 8,999,811 B2 | 4/2015 | Endo et al. |
| 9,093,635 B2 | 7/2015 | Kim et al. |
| 9,166,163 B2 | 10/2015 | Gee et al. |
| 2002/0048940 A1 | 4/2002 | Derderian et al. |
| 2003/0006440 A1 | 1/2003 | Uchiyama |
| 2003/0036238 A1 | 2/2003 | Toet et al. |
| 2003/0052330 A1 | 3/2003 | Klein |
| 2003/0141565 A1 | 7/2003 | Hirose et al. |
| 2003/0174574 A1 | 9/2003 | Perner et al. |
| 2003/0194865 A1 | 10/2003 | Gilton |
| 2003/0206659 A1 | 11/2003 | Hamanaka |
| 2004/0026682 A1 | 2/2004 | Jiang |
| 2004/0036124 A1 | 2/2004 | Vyvoda et al. |
| 2004/0159835 A1 | 8/2004 | Krieger et al. |
| 2004/0170040 A1 | 9/2004 | Rinerson et al. |
| 2004/0192006 A1 | 9/2004 | Campbell et al. |
| 2004/0194340 A1 | 10/2004 | Kobayashi |
| 2004/0202041 A1 | 10/2004 | Hidenori |
| 2005/0019699 A1 | 1/2005 | Moore |
| 2005/0020510 A1 | 1/2005 | Benedict |
| 2005/0029587 A1 | 2/2005 | Harshfield |
| 2005/0041498 A1 | 2/2005 | Resta et al. |
| 2005/0052915 A1 | 3/2005 | Herner et al. |
| 2005/0062045 A1 | 3/2005 | Bhattacharyya |
| 2005/0073881 A1 | 4/2005 | Tran et al. |
| 2005/0101081 A1 | 5/2005 | Goda et al. |
| 2005/0175099 A1 | 8/2005 | Sarkijarvi et al. |
| 2006/0017488 A1 | 1/2006 | Hsu |
| 2006/0028895 A1 | 2/2006 | Taussig et al. |
| 2006/0054950 A1 | 3/2006 | Baek et al. |
| 2006/0134837 A1 | 6/2006 | Subramanian et al. |
| 2006/0154417 A1 | 7/2006 | Shinmura et al. |
| 2006/0215445 A1 | 9/2006 | Baek et al. |
| 2006/0231910 A1 | 10/2006 | Hsieh et al. |
| 2006/0246606 A1 | 11/2006 | Hsu et al. |
| 2006/0268594 A1 | 11/2006 | Toda |
| 2006/0279979 A1 | 12/2006 | Lowrey et al. |
| 2006/0281244 A1 | 12/2006 | Ichige et al. |
| 2006/0286762 A1 | 12/2006 | Tseng et al. |
| 2007/0008773 A1 | 1/2007 | Scheuerlein |
| 2007/0015348 A1 | 1/2007 | Hsu et al. |
| 2007/0025144 A1 | 2/2007 | Hsu et al. |
| 2007/0035990 A1 | 2/2007 | Hush |
| 2007/0042612 A1 | 2/2007 | Nishino et al. |
| 2007/0045615 A1 | 3/2007 | Cho et al. |
| 2007/0069119 A1 | 3/2007 | Appleyard et al. |
| 2007/0087508 A1 | 4/2007 | Herner |
| 2007/0090425 A1 | 4/2007 | Kumar et al. |
| 2007/0091685 A1 | 4/2007 | Guterman et al. |
| 2007/0105284 A1 | 5/2007 | Herner |
| 2007/0105390 A1 | 5/2007 | Oh |
| 2007/0133250 A1 | 6/2007 | Kim |
| 2007/0133270 A1 | 6/2007 | Jeong et al. |
| 2007/0159869 A1 | 7/2007 | Baek et al. |
| 2007/0159876 A1 | 7/2007 | Sugibayashi et al. |
| 2007/0171698 A1 | 7/2007 | Hoenigschmid et al. |
| 2007/0205510 A1 | 9/2007 | Lavoie et al. |
| 2007/0228414 A1 | 10/2007 | Kumar et al. |
| 2007/0284575 A1 | 12/2007 | Li et al. |
| 2007/0290186 A1 | 12/2007 | Bourim et al. |
| 2007/0291527 A1 | 12/2007 | Tsushima et al. |
| 2007/0295950 A1 | 12/2007 | Cho et al. |
| 2007/0297501 A1 | 12/2007 | Hussain et al. |
| 2008/0002481 A1 | 1/2008 | Gogl et al. |
| 2008/0006907 A1 | 1/2008 | Lee et al. |
| 2008/0007987 A1 | 1/2008 | Takashima |
| 2008/0019163 A1 | 1/2008 | Hoenigschmid et al. |
| 2008/0043521 A1 | 2/2008 | Liaw et al. |
| 2008/0048164 A1 | 2/2008 | Odagawa |
| 2008/0083918 A1 | 4/2008 | Aratani et al. |
| 2008/0089110 A1 | 4/2008 | Robinett et al. |
| 2008/0090337 A1 | 4/2008 | Williams |
| 2008/0106925 A1 | 5/2008 | Paz de Araujo et al. |

(56) References Cited

U.S. PATENT DOCUMENTS

| | | |
|---|---|---|
| 2008/0106926 A1 | 5/2008 | Brubaker et al. |
| 2008/0165571 A1 | 7/2008 | Lung |
| 2008/0185567 A1 | 8/2008 | Kumar et al. |
| 2008/0192531 A1 | 8/2008 | Tamura et al. |
| 2008/0198934 A1 | 8/2008 | Hong et al. |
| 2008/0205179 A1 | 8/2008 | Markert et al. |
| 2008/0206931 A1 | 8/2008 | Breuil et al. |
| 2008/0220601 A1 | 9/2008 | Kumar et al. |
| 2008/0232160 A1 | 9/2008 | Gopalakrishnan |
| 2008/0278988 A1 | 11/2008 | Ufert |
| 2008/0278990 A1 | 11/2008 | Kumar et al. |
| 2008/0301497 A1 | 12/2008 | Chung et al. |
| 2008/0304312 A1 | 12/2008 | Ho et al. |
| 2008/0311722 A1 | 12/2008 | Petti et al. |
| 2009/0001343 A1 | 1/2009 | Schricker et al. |
| 2009/0001345 A1 | 1/2009 | Schricker et al. |
| 2009/0003717 A1 | 1/2009 | Sekiguchi et al. |
| 2009/0014703 A1 | 1/2009 | Inaba |
| 2009/0014707 A1 | 1/2009 | Lu et al. |
| 2009/0052226 A1 | 2/2009 | Lee et al. |
| 2009/0091981 A1 | 4/2009 | Park et al. |
| 2009/0095951 A1 | 4/2009 | Kostylev et al. |
| 2009/0109728 A1 | 4/2009 | Maejima et al. |
| 2009/0122591 A1 | 5/2009 | Ryu |
| 2009/0134432 A1 | 5/2009 | Tabata et al. |
| 2009/0141567 A1 | 6/2009 | Lee et al. |
| 2009/0152737 A1 | 6/2009 | Harshfield |
| 2009/0168486 A1 | 7/2009 | Kumar |
| 2009/0227067 A1 | 9/2009 | Kumar et al. |
| 2009/0231905 A1 | 9/2009 | Sato |
| 2009/0231910 A1 | 9/2009 | Liu et al. |
| 2009/0250787 A1 | 10/2009 | Kutsunai |
| 2009/0251941 A1 | 10/2009 | Saito |
| 2009/0256130 A1 | 10/2009 | Schricker |
| 2009/0257265 A1 | 10/2009 | Chen et al. |
| 2009/0267047 A1 | 10/2009 | Sasago et al. |
| 2009/0268513 A1 | 10/2009 | De Ambroggi et al. |
| 2009/0272962 A1 | 11/2009 | Kumar et al. |
| 2009/0283737 A1 | 11/2009 | Kiyotoshi |
| 2009/0298224 A1 | 12/2009 | Lowrey |
| 2009/0309087 A1 | 12/2009 | Lung |
| 2009/0321706 A1 | 12/2009 | Happ et al. |
| 2009/0321789 A1 | 12/2009 | Wang et al. |
| 2010/0007937 A1 | 1/2010 | Widjaja et al. |
| 2010/0012914 A1 | 1/2010 | Xu et al. |
| 2010/0019221 A1 | 1/2010 | Lung et al. |
| 2010/0019310 A1 | 1/2010 | Sakamoto |
| 2010/0025675 A1 | 2/2010 | Yamazaki et al. |
| 2010/0032637 A1 | 2/2010 | Kinoshita et al. |
| 2010/0032638 A1 | 2/2010 | Xu |
| 2010/0032640 A1 | 2/2010 | Xu |
| 2010/0034518 A1 | 2/2010 | Iwamoto et al. |
| 2010/0038791 A1 | 2/2010 | Lee et al. |
| 2010/0039136 A1 | 2/2010 | Chua-Eoan et al. |
| 2010/0044708 A1 | 2/2010 | Lin et al. |
| 2010/0044798 A1 | 2/2010 | Hooker et al. |
| 2010/0046622 A1 | 2/2010 | Doser et al. |
| 2010/0067279 A1 | 3/2010 | Choi |
| 2010/0067282 A1 | 3/2010 | Liu et al. |
| 2010/0084625 A1 | 4/2010 | Wicker et al. |
| 2010/0085798 A1 | 4/2010 | Lu et al. |
| 2010/0085822 A1 | 4/2010 | Yan et al. |
| 2010/0090192 A1 | 4/2010 | Goux et al. |
| 2010/0101290 A1 | 4/2010 | Bertolotto |
| 2010/0102290 A1 | 4/2010 | Lu et al. |
| 2010/0110767 A1 | 5/2010 | Katoh et al. |
| 2010/0118587 A1 | 5/2010 | Chen et al. |
| 2010/0140614 A1 | 6/2010 | Uchiyama et al. |
| 2010/0157651 A1 | 6/2010 | Kumar et al. |
| 2010/0157656 A1 | 6/2010 | Tsuchida |
| 2010/0157659 A1 | 6/2010 | Norman |
| 2010/0157710 A1 | 6/2010 | Lambertson et al. |
| 2010/0163828 A1 | 7/2010 | Tu |
| 2010/0171086 A1 | 7/2010 | Lung et al. |
| 2010/0176367 A1 | 7/2010 | Liu |
| 2010/0176368 A1 | 7/2010 | Ko et al. |
| 2010/0182821 A1 | 7/2010 | Muraoka et al. |
| 2010/0203731 A1 | 8/2010 | Kong et al. |
| 2010/0219510 A1 | 9/2010 | Scheuerlein et al. |
| 2010/0221868 A1 | 9/2010 | Sandoval |
| 2010/0237314 A1 | 9/2010 | Tsukamoto et al. |
| 2010/0243983 A1 | 9/2010 | Chiang et al. |
| 2010/0258781 A1 | 10/2010 | Phatak et al. |
| 2010/0271885 A1 | 10/2010 | Scheuerlein et al. |
| 2010/0277969 A1 | 11/2010 | Li et al. |
| 2010/0321095 A1 | 12/2010 | Mikawa et al. |
| 2011/0006275 A1 | 1/2011 | Roelofs et al. |
| 2011/0007551 A1 | 1/2011 | Tian et al. |
| 2011/0033967 A1 | 2/2011 | Lutz et al. |
| 2011/0063888 A1 | 3/2011 | Chi et al. |
| 2011/0066878 A1 | 3/2011 | Hosono et al. |
| 2011/0068373 A1 | 3/2011 | Minemura et al. |
| 2011/0069533 A1 | 3/2011 | Kurosawa et al. |
| 2011/0089391 A1 | 4/2011 | Mihnea et al. |
| 2011/0122679 A1 | 5/2011 | Chen et al. |
| 2011/0128779 A1 | 6/2011 | Redaelli et al. |
| 2011/0133149 A1 | 6/2011 | Sonehara |
| 2011/0136327 A1 | 6/2011 | Han et al. |
| 2011/0151277 A1 | 6/2011 | Nishihara et al. |
| 2011/0155991 A1 | 6/2011 | Chen |
| 2011/0183525 A1 | 7/2011 | Purushothaman et al. |
| 2011/0193051 A1 | 8/2011 | Nam et al. |
| 2011/0194329 A1 | 8/2011 | Ohba et al. |
| 2011/0198557 A1 | 8/2011 | Rajendran et al. |
| 2011/0204312 A1 | 8/2011 | Phatak |
| 2011/0204314 A1 | 8/2011 | Baek et al. |
| 2011/0205780 A1 | 8/2011 | Yasuda et al. |
| 2011/0205782 A1 | 8/2011 | Costa et al. |
| 2011/0212616 A1 | 9/2011 | Seidel et al. |
| 2011/0227028 A1 | 9/2011 | Sekar et al. |
| 2011/0284814 A1 | 11/2011 | Zhang |
| 2011/0299324 A1 | 12/2011 | Li et al. |
| 2011/0305064 A1 | 12/2011 | Jo et al. |
| 2011/0310656 A1 | 12/2011 | Kreupl et al. |
| 2011/0312151 A1 | 12/2011 | Herner |
| 2011/0317470 A1 | 12/2011 | Lu et al. |
| 2012/0001145 A1 | 1/2012 | Magistretti et al. |
| 2012/0001146 A1 | 1/2012 | Lu et al. |
| 2012/0007035 A1 | 1/2012 | Jo et al. |
| 2012/0008366 A1 | 1/2012 | Lu |
| 2012/0012806 A1 | 1/2012 | Herner |
| 2012/0012808 A1 | 1/2012 | Herner |
| 2012/0015506 A1 | 1/2012 | Jo et al. |
| 2012/0025161 A1 | 2/2012 | Rathor et al. |
| 2012/0033479 A1 | 2/2012 | Delucca et al. |
| 2012/0043519 A1 | 2/2012 | Jo et al. |
| 2012/0043520 A1 | 2/2012 | Herner et al. |
| 2012/0043621 A1 | 2/2012 | Herner |
| 2012/0043654 A1 | 2/2012 | Lu et al. |
| 2012/0044751 A1 | 2/2012 | Wang et al. |
| 2012/0074374 A1 | 3/2012 | Jo |
| 2012/0074507 A1 | 3/2012 | Jo et al. |
| 2012/0076203 A1 | 3/2012 | Sugimoto et al. |
| 2012/0080798 A1 | 4/2012 | Harshfield |
| 2012/0087169 A1 | 4/2012 | Kuo et al. |
| 2012/0087172 A1 | 4/2012 | Aoki |
| 2012/0091420 A1 | 4/2012 | Kusai et al. |
| 2012/0104351 A1 | 5/2012 | Wei et al. |
| 2012/0108030 A1 | 5/2012 | Herner |
| 2012/0120712 A1 | 5/2012 | Kawai et al. |
| 2012/0122290 A1 | 5/2012 | Nagashima |
| 2012/0140816 A1 | 6/2012 | Franche et al. |
| 2012/0142163 A1 | 6/2012 | Herner |
| 2012/0145984 A1 | 6/2012 | Rabkin et al. |
| 2012/0147657 A1 | 6/2012 | Sekar et al. |
| 2012/0155146 A1 | 6/2012 | Ueda et al. |
| 2012/0176831 A1 | 7/2012 | Xiao et al. |
| 2012/0205606 A1 | 8/2012 | Lee et al. |
| 2012/0205793 A1 | 8/2012 | Schieffer et al. |
| 2012/0218807 A1 | 8/2012 | Johnson |
| 2012/0220100 A1 | 8/2012 | Herner |
| 2012/0224413 A1 | 9/2012 | Zhang et al. |
| 2012/0235112 A1 | 9/2012 | Huo et al. |
| 2012/0236625 A1 | 9/2012 | Ohba et al. |

(56) References Cited

U.S. PATENT DOCUMENTS

| | | |
|---|---|---|
| 2012/0241710 A1 | 9/2012 | Liu et al. |
| 2012/0243292 A1 | 9/2012 | Takashima et al. |
| 2012/0250183 A1 | 10/2012 | Tamaoka et al. |
| 2012/0252183 A1 | 10/2012 | Herner |
| 2012/0269275 A1 | 10/2012 | Hannuksela |
| 2012/0305874 A1 | 12/2012 | Herner |
| 2012/0305879 A1 | 12/2012 | Lu et al. |
| 2012/0320660 A1 | 12/2012 | Nazarian et al. |
| 2012/0326265 A1 | 12/2012 | Lai et al. |
| 2012/0327701 A1 | 12/2012 | Nazarian |
| 2013/0020548 A1 | 1/2013 | Clark et al. |
| 2013/0023085 A1 | 1/2013 | Pramanik et al. |
| 2013/0026440 A1 | 1/2013 | Yang et al. |
| 2013/0065066 A1 | 3/2013 | Sambasivan et al. |
| 2013/0075685 A1 | 3/2013 | Li et al. |
| 2013/0075688 A1 | 3/2013 | Xu et al. |
| 2013/0119341 A1 | 5/2013 | Liu et al. |
| 2013/0128653 A1 | 5/2013 | Kang et al. |
| 2013/0134379 A1 | 5/2013 | Lu |
| 2013/0166825 A1 | 6/2013 | Kim et al. |
| 2013/0207065 A1 | 8/2013 | Chiang |
| 2013/0214234 A1 | 8/2013 | Gopalan et al. |
| 2013/0235648 A1 | 9/2013 | Kim et al. |
| 2013/0264535 A1 | 10/2013 | Sonehara |
| 2013/0279240 A1 | 10/2013 | Jo |
| 2013/0308369 A1 | 11/2013 | Lu et al. |
| 2014/0015018 A1 | 1/2014 | Kim |
| 2014/0029327 A1 | 1/2014 | Strachan et al. |
| 2014/0070160 A1 | 3/2014 | Ishikawa et al. |
| 2014/0103284 A1 | 4/2014 | Hsueh et al. |
| 2014/0145135 A1 | 5/2014 | Gee et al. |
| 2014/0166961 A1 | 6/2014 | Liao et al. |
| 2014/0175360 A1 | 6/2014 | Tendulkar et al. |
| 2014/0177315 A1 | 6/2014 | Pramanik et al. |
| 2014/0192589 A1 | 7/2014 | Maxwell et al. |
| 2014/0197369 A1 | 7/2014 | Sheng et al. |
| 2014/0233294 A1 | 8/2014 | Ting et al. |
| 2014/0264236 A1 | 9/2014 | Kim et al. |
| 2014/0264250 A1 | 9/2014 | Maxwell et al. |
| 2014/0268997 A1 | 9/2014 | Nazarian et al. |
| 2014/0268998 A1 | 9/2014 | Jo |
| 2014/0269002 A1 | 9/2014 | Jo |
| 2014/0312296 A1 | 10/2014 | Jo et al. |
| 2014/0335675 A1 | 11/2014 | Narayanan |
| 2015/0070961 A1 | 3/2015 | Katayama et al. |
| 2015/0228334 A1 | 8/2015 | Nazarian et al. |
| 2016/0111640 A1 | 4/2016 | Chang et al. |

FOREIGN PATENT DOCUMENTS

| | | |
|---|---|---|
| CN | 101501850 | 8/2009 |
| CN | 101636792 A | 1/2010 |
| CN | 102024494 A | 4/2011 |
| CN | 102077296 A | 5/2011 |
| EP | 1096465 A2 | 5/2001 |
| EP | 2405441 A1 | 1/2012 |
| EP | 2408035 A2 | 1/2012 |
| JP | 2005-506703 A | 3/2005 |
| JP | 2006-032951 A | 2/2006 |
| JP | 2007-067408 A | 3/2007 |
| JP | 2007-281208 A | 10/2007 |
| JP | 2007-328857 A | 12/2007 |
| JP | 2008503085 | 1/2008 |
| JP | 2008147343 | 6/2008 |
| JP | 2009043873 | 2/2009 |
| JP | 2011023645 A | 2/2011 |
| JP | 2011065737 | 3/2011 |
| JP | 2012504840 | 2/2012 |
| JP | 2012505551 | 3/2012 |
| JP | 2012089567 | 5/2012 |
| JP | 2012533195 | 12/2012 |
| KR | 20090051206 A | 5/2009 |
| KR | 1020110014248 A | 2/2011 |
| WO | WO 03/034498 A1 | 4/2003 |
| WO | 2005124787 | 12/2005 |
| WO | WO 2009/005699 A1 | 1/2009 |
| WO | 2010026654 | 3/2010 |
| WO | 2010042354 | 4/2010 |
| WO | 2010042732 | 4/2010 |
| WO | 2011005266 A1 | 1/2011 |
| WO | 2011008654 | 1/2011 |
| WO | 2011133138 A1 | 10/2011 |

OTHER PUBLICATIONS

André Dehon, "Array-Based Architecture for FET-Based, Nanoscale Electronics", IEEE Transactions on Nanotechnology, Mar. 2003, pp. 23-32, vol. 2, No. 1, IEEE.
Herb Goronkin et al., "High-Performance Emerging Solid-State Memory Technologies", MRS Bulletin, www.mrs.org/publications/bulletin, Nov. 2004, pp. 805-813.
Gerhard Müller et al., "Status and Outlook of Emerging Nonvolatile Memory Technologies", IEEE, 2004, pp. 567-570.
A.E. Owen et al., "Memory Switching in Amorphous Silicon Devices", Journal of Non-Crystalline Solids 59 & 60,1983, pp. 1273-1280, North Holland Publishing Company/Physical Society of Japan.
J. Campbell Scott, "Is There an Immortal Memory?", www.sciencemag.org, Apr. 2, 2004, pp. 62-63, vol. 304 No. 5667, American Association for the Advancement of Science.
S.H. Lee et al., "Full Integration and Cell Characteristics for 64Mb Nonvolatile PRAM", 2004 Symposium on VLSI Technology Digest of Technical Papers, IEEE, 2004, pp. 20-21.
Stephen Y. Chou et al., "Imprint Lithography With 25-Nanometer Resolution", Science, Apr. 5, 1996, pp. 85-87, vol. 272, American Association for the Advancement of Science.
S. Zankovych et al., "Nanoimprint Lithography: challenges and prospects", Nanotechnology, 2001, pp. 91-95, vol. 12, Institute of Physics Publishing.
A. Avila et al., "Switching in coplanar amorphous hydrogenated silicon devices", Solid-State Electronics, 2000, pp. 17-27, vol. 44, Elsevier Science Ltd.
Jian Hu et al., "Switching and filament formation in hot-wire CVD p-type a-Si:H devices", Thin Solid Films, Science Direct, www.sciencedirect.com, 2003, pp. 249-252, vol. 430, Elsevier Science B.V.
S. Hudgens et al., "Overview of Phase-Change Chalcogenide Nonvolatile Memory Technology", MRS Bulletin, www.mrs.org/publications/bulletin, Nov. 2004, pp. 829-832.
K. Terabe et al., "Quantized conductance atomic switch", Nature, www.nature.com/nature, Jan. 6, 2005, pp. 47-50, vol. 433, Nature Publishing Group.
Michael Kund et al., "Conductive bridging RAM (CBRAM): An emerging non-volatile memory technology scalable to sub 20nm", IEEE, 2005.
W. Den Boer, "Threshold switching in hydrogenated amorphous silicon", Appl. Phys. Letter, 1982, pp. 812-813, vol. 40, American Institute of Physics.
P.G. Lecomber et al., "The Switching Mechanism in Amorphous Silicon Junctions", Journal of Non-Crystalline Solids,1985, pp. 1373-1382, vol. 77 & 78, Elsevier Science Publishers B.V., North Holland Physics Publishing Division, North-Holland, Amsterdam.
A. E. Owen et al., "Switching in amorphous devices", Int. J. Electronics, 1992, pp. 897-906, vol. 73, No. 5, Taylor and Francis Ltd.
M. Jafar et al., "Switching in amorphous-silicon devices", Physical Review B, May 15, 1994, pp. 611-615, vol. 49, No. 19, The American Physical Society.
Alexandra Stikeman, "Polymer Memory—The plastic path to better data storage", Technology Review, www.technologyreview.com, Sep. 2002, pp. 31.
Yong Chen et al., "Nanoscale molecular-switch crossbar circuits", Nanotechnology, 2003, pp. 462-468, vol. 14, Institute of Physics Publishing Ltd.
C. P. Collier et al., "Electronically Configurable Molecular-Based Logic Gates", Science Jul. 16, 1999, pp. 391-395, vol. 285, No. 5426, American Association for the Advancement of Science.
Office Action for U.S. Appl. No. 11/875,541 dated Jul. 22, 2010.

(56) References Cited

OTHER PUBLICATIONS

Office Action for U.S. Appl. No. 11/875,541 dated Mar. 30, 2011.
Office Action for U.S. Appl. No. 11/875,541 dated Oct. 5, 2011.
Office Action for U.S. Appl. No. 11/875,541 dated Jun. 8, 2012.
Jang Wook Choi, "Bistable [2]Rotaxane Based Molecular Electronics: Fundamentals and Applications", Dissertation, Chapter 3, <http://resolver.caltech.edu/CaltechETD:etd-052412007-194737> 2007, pp. 79-120, California Institute of Technology, Pasadena.
Sung-Hyun Jo et al., "A Silicon-Based Crossbar Ultra-High-Density Non-Volatile Memory", SSEL Annual Report 2007.
International Search Report for PCT/US2009/060023 filed on Oct. 8, 2009.
Rainer Waser et al., "Nanoionics-based resistive switching memories", Nature Materials, Nov. 2007, pp. 833-835, vol. 6, Nature Publishing Group.
Written Opinion of the International Searching Authority for PCT/US2009/060023 filed on Oct. 8, 2009.
Ex parte Quayle Action for U.S. Appl. No. 12/826,653 dated May 8, 2012.
International Search Report for PCT/US2011/040090 filed on Jun. 10, 2011.
Written Opinion of the International Searching Authority for PCT/US2011/040090 filed on Jun. 10, 2011.
Notice of Allowance for U.S. Appl. No. 13/158,231 dated Apr. 17, 2012.
Office Action for U.S. Appl. No. 12/835,704 dated Sep. 21, 2011.
Office Action for U.S. Appl. No. 12/835,704 dated Mar. 1, 2012.
Advisory Action for U.S. Appl. No. 12/835,704 dated Jun. 8, 2012.
International Search Report and Written Opinion for PCT/US2011/046035 filed on Jul. 29, 2011.
Office Action for U.S. Appl. No. 12/861,650 dated Jan. 25, 2012.
Notice of Allowance for U.S. Appl. No. 12/861,650 dated Jun. 19, 2012.
Sung Hyun Jo et al., "Programmable Resistance Switching in Nanoscale Two-Terminal Devices," Supporting Information, Dec. 29, 2008, pp. 1-4, vol. 9., No. 1, Department of Electrical Engineering and Computer Science, the University of Michigan, Ann Arbor, Michigan.
Kuk-Hwan Kim et al., "Nanoscale resistive memory with intrinsic diode characteristics and long endurance," Applied Physics Letters, 2010, pp. 053106-1-053106-3, vol. 96, American Institute of Physics.
Sung Hyun Jo et al., "Si-Based Two-Terminal Resistive Switching Nonvolatile Memory", IEEE, 2008.
Sung Hyun Jo et al., "Nanoscale Memristor Device as Synapse in Neuromorphic Systems", Nano Letters, 10, 1297-1301, 2010, pubs.acs.org/NanoLett, A-E, American Chemical Society Publications.
Wei Lu et al., "Nanoelectronics from the bottom up", Nature Materials, www.nature.com/naturematerials, Nov. 2007, pp. 841-850, vol. 6, Nature Publishing Group.
Sung Hyun Jo et al., "Ag/a-Si:H/c-Si Resistive Switching Nonvolatile Memory Devices", Nanotechnology Materials and Devices Conference, IEEE, 2006, pp. 116-117, vol. 1.
Sung Hyun Jo et al., "Experimental, Modeling and Simulation Studies of Nanoscale Resistance Switching Devices", $9^{th}$ Conference on Nanotechnology, IEEE, 2009, pp. 493-495.
Sung Hyun Jo et al., "Nonvolatile Resistive Switching Devices Based on Nanoscale Metal/Amorphous Silicon/Crystalline Silicon Junctions", Mater. Res. Soc. Symp. Proc., 2007, vol. 997, Materials Research Society.
Sung Hyun Jo et al., "Si Memristive Devices Applied to Memory and Neuromorphic Circuits", Proceedings of 2010 IEEE International Symposium on Circuits and Systems, 2010, pp. 13-16.
Wei Lu et al., "Supporting Information", 2008.
Sung Hyun Jo et al., "High-Density Crossbar Arrays Based on a Si Memristive System", Nano Letters, 2009, pp. 870-874, vol. 9 No. 2, American Chemical Society Publications.
Sung Hyun Jo et al., "High-Density Crossbar Arrays Based on a Si Memristive System", Supporting Information, 2009, pp. 1-4.

Sung Hyun Jo et al., "Programmable Resistance Switching in Nanoscale Two-Terminal Devices", Nano Letters, 2009, pp. 496-500, vol. 9 No. 1, American Chemical Society Publications.
Shubhra Gangopadhyay et al., "Memory Switching in Sputtered Hydrogenated Amorphous Silicon (a-Si:H)", Japanese Journal of Applied Physics, Short Notes, 1985, pp. 1363-1364, vol. 24 No. 10.
S. K. Dey, "Electrothermal model of switching in amorphous silicon films", J. Vac. Sci. Technol., Jan./Feb. 1980, pp. 445-448, vol. 17, No. 1, American Vacuum Society.
J. Hajto et al., "The Programmability of Amorphous Silicon Analogue Memory Elements", Mat. Res. Soc. Symp. Proc., 1990, pp. 405-410, vol. 192, Materials Research Society.
M. J. Rose et al., "Amorphous Silicon Analogue Memory Devices", Journal of Non-Crystalline Solids, 1989, pp. 168-170, vol. 115, Elsevier Science Publishers B.V., North-Holland.
A. Moopenn et al., "Programmable Synaptic Devices for Electronic Neural Nets", Control and Computers, 1990, pp. 37-41, vol. 18 No. 2.
P.G. Le Comber, "Present and Future Applications of Amorphous Silicon and Its Alloys", Journal of Non-Crystalline Solids, 1989, pp. 1-13, vol. 115, Elsevier Science Publishers B.V., North-Holland.
J. Hu, et al., "AC Characteristics of $Cr/p^+a$-Si:H/V Analog Switching Devices", IEEE Transactions on Electron Devices, Sep. 2000, pp. 1751-1757, vol. 47 No. 9, IEEE.
A.E. Owen et al., "New amorphous-silicon electrically programmable nonvolatile switching device", Solid-State and Electron Devices, IEEE Proceedings, Apr. 1982, pp. 51-54, vol. 129, Pt. I., No. 2.
J. Hajto et al., "Amorphous & Microcrystalline Semiconductor Devices: vol. 2, Materials and Device Physics", Mar. 1, 2004, pp. 640-700, Artech House Publishers.
J. Hajto et al., "Analogue memory and ballistic electron effects in metal-amorphous silicon structures", Philosophical Magazine B, 1991, pp. 349-369, vol. 63 No. 1, Taylor & Francis Ltd.
A. J. Holmes et al., "Design of Analogue Synapse Circuits using Non-Volatile a-Si:H Memory Devices", Proceedings of ISCAS, 1994, pp. 351-354.
Yajie Dong et al., "Si/a-Si Core/Shell Nanowires as Nonvolatile Crossbar Switches", Nano Letters, Jan. 2008, pp. 386-391, vol. 8 No. 2, American Chemical Society.
European Search Report for Application No. EP 09 81 9890.6 of Mar. 27, 2012.
D. A. Muller et al., "The Electronic structure at the atomic scale of ultrathin gate oxides", Nature, Jun. 24, 1999, pp. 758-761, vol. 399.
J. Suñé et al., "Nondestructive multiple breakdown events in very thin $SiO_2$ films", Applied Physics Letters, 1989, pp. 128-130, vol. 55.
Herve Marand et al., MESc. 5025 lecture notes: Chapter 7. Diffusion, University of Vermont, http://www.files.chem.vt.edu/chem-dept/marand/MEScchap6-1c.pdf.
A. E. Owen et al., "Electronic Switching in Amorphous Silicon Devices: Properties of the Conducting Filament", Proceedings of 5th International Conference on Solid-State and Integrated Circuit Technology, IEEE, 1998, pp. 830-833.
Sung Hyun Jo, "Nanoscale Memristive Devices for Memory and Logic Applications", Ph. D dissertation, University of Michigan, 2010.
Office Action for U.S. Appl. No. 12/894,098 dated Aug. 1, 2012.
Sung Hyun Jo et al., "CMOS Compatible Nanoscale Nonvolatile Resistance Switching Memory", Nano Letters, 2008, pp. 392-397, vol. 8, No. 2.
Office Action for U.S. Appl. No. 12/582,086 dated Apr. 19, 2011.
Office Action for U.S. Appl. No. 12/582,086 dated Sep. 6, 2011.
Notice of Allowance for U.S. Appl. No. 12/582,086 dated Oct. 21, 2011.
International Search Report for PCT/US2009/061249 filed on Oct. 20, 2009.
Written Opinion of the International Searching Authority for PCT/US2009/061249 filed on Oct. 20, 2009.
Office Action for U.S. Appl. No. 12/861,650 dated Oct. 16, 2012.
Notice of Allowance for U.S. Appl. No. 12/894,087 dated Oct. 25, 2012.

(56) References Cited

OTHER PUBLICATIONS

Notice of Allowance for U.S. Appl. No. 13/149,807 dated Oct. 29, 2012.
Notice of Allowance for U.S. Appl. No. 12/861,666 dated Nov. 14, 2012.
Office Action for U.S. Appl. No. 13/156,232, dated Nov. 26, 2012.
Notice of Allowance for U.S. Appl. No. 13/290,024 dated Nov. 28, 2012.
Notice of Allowance for U.S. Appl. No. 12/814,410 dated Jan. 8, 2013.
Corrected Notice of Allowance for U.S. Appl. No. 12/861,666 dated Jan. 11, 2013.
Supplemental Notice of Allowance for U.S. Appl. No. 12/894,087 dated Jan. 11, 2013.
Notice of Allowance for U.S. Appl. No. 13/314,513 dated Jan. 24, 2013.
Notice of Allowance for U.S. Appl. No. 13/118,258, dated Feb. 6, 2013.
International Search Report and Written Opinion for PCT/US2012/040242, filed May 31, 2012.
Office Action for U.S. Appl. No. 12/861,432, dated Mar. 29, 2013.
Notice of Allowance for U.S. Appl. No. 13/769,152, dated Oct. 8, 2013.
Notice of Allowance for U.S. Appl. No. 13/905,074, dated Oct. 8, 2013
Notice of Allowance for U.S. Appl. No. 13/452,657, dated Oct. 10, 2013.
Notice of Allowance for U.S. Appl. No. 13/174,264, dated Oct. 16, 2013.
Notice of Allowance for U.S. Appl. No. 13/417,135, dated Oct. 23, 2013.
Notice of Allowance for U.S. Appl. No. 13/725,331, dated Jan. 17, 2014.
Office Action for U.S. Appl. No. 13/739,283, dated Jan. 16, 2014.
Office Action for U.S. Appl. No. 12/861,432, dated Jan. 8, 2014.
Office Action for U.S. Appl. No. 13/586,815, dated Jan. 29, 2014.
International Search Report and Written Opinion for PCT/US2013/061244, filed on Sep. 23, 2013.
Office Action for U.S. Appl. No. 13/434,567, dated Feb. 6, 2014.
Office Action for U.S. Appl. No. 13/620,012, dated Feb. 11, 2014.
Notice of Allowance for U.S. Appl. No. 13/468,201, dated Feb. 20, 2014.
Office Action for U.S. Appl. No. 12/625,817, dated Feb. 28, 2014.
Office Action for U.S. Appl. No. 12/835,704, dated Mar. 14, 2014.
Office Action for U.S. Appl. No. 13/870,919, Dated Apr. 3, 2014.
Office Action for U.S. Appl. No. 13/167,920, dated Mar. 12, 2014.
International Search Report and Written Opinion for PCT/US2013/077628, filed on Dec. 23, 2013.
Office Action for U.S. Appl. No. 13/143,047, dated Apr. 11, 2014.
Office Action for U.S. Appl. No. 13/761,132, dated Apr. 25, 2014.
Office Action for U.S. Appl. No. 12/814,410 dated Apr. 17, 2012.
Office Action for U.S. Appl. No. 12/835,699 dated Aug. 24, 2011.
Notice of Allowance for U.S. Appl. No. 12/835,699 dated Feb. 6, 2012.
Office Action for U.S. Appl. No. 12/833,898 dated Apr. 5, 2012.
European Search Report for Application No. EP 1100 5207.3 of Oct. 12, 2011.
Notice of Allowance for U.S. Appl. No. 12/833,898 dated May 30, 2012.
Notice of Allowance for U.S. Appl. No. 12/939,824 dated May 11, 2012.
Notice of Allowance for U.S. Appl. No. 12/940,920 dated Oct. 5, 2011.
Office Action for U.S. Appl. No. 13/314,513 dated Mar. 27, 2012.
Shong Yin, "Solution Processed Silver Sulfide Thin Films for Filament Memory Applications", Technical Report No. UCB/EECS-2010-166, http://www.eecs.berkeley.edu/Pubs/TechRpts/2010/EECS-2010-166.html, Dec. 17, 2010, Electrical Engineering and Computer Sciences, University of California at Berkeley.
Office Action for U.S. Appl. No. 13/149,653 dated Apr. 25, 2012.

International Search Report for PCT/US2011/045124 filed on Jul. 22, 2011.
Written Opinion of the International Searching Authority for PCT/US2011/045124 filed on Jul. 22, 2011.
Peng-Heng Chang et al., "Aluminum spiking at contact windows in Al/Ti—W/Si", Appl. Phys. Lett., Jan. 25, 1988, pp. 272-274, vol. 52 No. 4, American Institute of Physics.
J. Del Alamo et al., "Operating Limits of Al-Alloyed High-Low Junctions for BSF Solar Cells", Solid-State Electronics, 1981, pp. 415-420, vol. 24, Pergamon Press Ltd., Great Britain.
Hao-Chih Yuan et al., "Silicon Solar Cells with Front Hetero-Contact and Aluminum Alloy Back Junction", NREL Conference Paper CP-520-42566, 33rd IEEE Photovoltaic Specialists Conference, May 11-16, 2008, National Renewable Energy Laboratory, San Diego, California.
Notice of Allowance for U.S. Appl. No. 12/939,824 dated Jul. 24, 2012.
Office Action for Application No. EP 1100 5207.3 dated Aug. 8, 2012.
Office Action for U.S. Appl. No. 13/417,135 dated Oct. 9, 2012.
Notice of Allowance for U.S. Appl. No. 13/532,019 dated Nov. 14, 2012.
Office Action for U.S. Appl. No. 13/149,653 dated Nov. 20, 2012.
Office Action of U.S. Appl. No. 13/436,714 dated Dec. 7, 2012.
Office Action mailed Dec. 6, 2013 for U.S. Appl. No. 13/960,735, 19 pages.
Office Action mailed Mar. 6, 2013 for U.S. Appl. No. 13/174,264, 30 pages.
Office Action mailed Mar. 6, 2013 for U.S. Appl. No. 13/679,976, 27 pages.
Office Action mailed Mar. 7, 2013 for U.S. Appl. No. 13/651,169, 15 pages.
Office Action mailed May 7, 2013 for U.S. Appl. No. 13/585,759, 22 pages.
European Office Action dated Aug. 8, 2012 for European Application No. EP11005207, 4 pages.
Office Action mailed Aug. 9, 2013 for U.S. Appl. No. 13/764,710, 15 pages.
Office Action mailed Jul. 9, 2013 for U.S. Appl. No. 13/447,036, 26 pages.
Office Action mailed Jul. 9, 2014 for U.S. Appl. No. 14/166,691, 18 pages.
Office Action mailed Jan. 10, 2014 for U.S. Appl. No. 13/920,021, 34 pages.
Office Action mailed Jul. 11, 2013 for U.S. Appl. No. 13/764,698, 14 pages.
Office Action mailed Sep. 11, 2014 for U.S. Appl. No. 13/739,283, 32 pages.
Office Action mailed Aug. 12, 2013 for U.S. Appl. No. 13/077,941, 64 pages.
Office Action mailed Sep. 12, 2014 for U.S. Appl. No. 13/426,869, 25 pages.
Office Action mailed Sep. 12, 2014 for U.S. Appl. No. 13/756,498, 43 pages.
Office Action mailed Feb. 13, 2014 for U.S. Appl. No. 13/174,077, 21 pages.
Office Action mailed Mar. 14, 2012 for U.S. Appl. No. 12/815,369, 18 pages.
Office Action mailed Apr. 16, 2012 for U.S. Appl. No. 12/834,610, 23 pages.
Office Action mailed May 16, 2012 for U.S. Appl. No. 12/815,318, 25 pages
Office Action mailed Feb. 17, 2011 for U.S. Appl. No. 12/913,719, 17 pages.
Office Action mailed Aug. 19, 2013 for U.S. Appl. No. 13/585,759, 15 pages.
Office Action mailed Jun. 19, 2012 for U.S. Appl. No. 13/149,757, 11 pages.
Office Action mailed Mar. 19, 2013 for U.S. Appl. No. 13/465,188, 13 pages.
Office Action mailed Mar. 19, 2013 for U.S. Appl. No. 13/564,639, 25 pages.

(56) References Cited

OTHER PUBLICATIONS

Office Action mailed May 20, 2013 for U.S. Appl. No. 13/725,331, 28 pages.
Office Action mailed Sep. 20, 2013 for U.S. Appl. No. 131481,600, 25 pages.
Office Action mailed Mar. 21, 2014 for U.S. Appl. No. 13/447,036, 27 pages.
Office Action mailed May 21, 2014 for U.S. Appl. No. 13/764,698, 31 pages.
Office Action mailed Sep. 21, 2011 for U.S. Appl. No. 12/835,704, 19 pages.
Office Action mailed Jul. 22, 2011 for U.S. Appl. No. 121913,719, 13 pages.
Office Action mailed Sep. 22, 2014 for U.S. Appl. No. 13/189,401, 26 pages.
Office Action mailed May 23, 2013 for U.S. Appl. No. 13/592,224, 21 pages.
Office Action mailed Sep. 25, 2013 for U.S. Appl. No. 13/194,479, 25 pages.
Office Action mailed Aug. 27, 2013 for U.S. Appl. No. 13/436,714, 20 pages.
Office Action mailed Dec. 27, 2013 for U.S Appl. No. 13/525,096, 23 pages.
Office Action mailed Jul. 29, 2013 for U.S. Appl. No. 13/466,008, 27 pages.
Office Action mailed Jul. 30, 2012 for U.S. Appl. No. 121900,232, 13 pages.
Office Action mailed Jun. 30, 2014 for U.S. Appl. No. 13/531,449, 19 pages.
Office Action mailed Sep. 30, 2013 for U.S. Appl. No. 13/189,401, 42 pages.
Office Action mailed Sep. 30, 2013 for U.S. Appl. No. 13/462,653, 35 pages.
Russo U., et al., "Self-Accelerated Thermal Dissolution Model for Reset Programming in Unipolar Resistive-Switching Memory (RRAM) Devices," IEEE Transactions on Electron Devices, 2009, vol. 56 (2), pp. 193-200.
Suehle J.S., et al., "Temperature Dependence of Soft Breakdown and Wear-out in Sub-3 Nm Si02 Films", 38th Annual International Reliability Physics Symposium, San Jose, California, 2000, pp. 33-39.
Written Opinion for PCT Application No. PCT/US2011/046036, mailed on Feb. 23, 2012, 4 pages.
European Search Report for European Application No. EP11005649 mailed Oct. 15, 2014, 2 pages.
Japanese Office Action (English Translation) for Japanese Application No. 2011-153349 mailed Feb. 24, 2015, 3 pages.
Japanese Search Report (English Translation) for Japanese Application No. 2011-153349 dated Februrary 9, 2015, 11 pages.
Japanese Office Action (English Translation) for Japanese Application No. 2013-525926 mailed Mar. 3, 2015, 4 pages.
Japanese Search Report (English Translation) for Japanese Application No. 2013-525926 dated Feb. 9, 2015, 15 pages.
Japanese Office Action (English Translation) for Japanese Application No. 2014-513700 mailed Jan. 12, 2016, 4 pages.
Japanese Search Report (English Translation) for Japanese Application No. 2014-513700 dated Jan. 14, 2016, 25 pages.
Cagli C., et al., "Evidence for Threshold Switching in the Set Process of Nio-based Rram and Physical Modeling for Set, Reset, Retention and Disturb Prediction", 2008 IEEE International Electron Devices Meeting (IEDM), Dec. 15-17, 2008, pp. 1-4, San Francisco, CA, USA.
Chang P.H., et al., "Aluminum Spiking at Contact Windows in Al/Ti--W/Si," Applied Physics Letters, 1988, vol. 52 (4), pp. 272-274.
Corrected Notice of Allowability mailed Oct. 1, 2013 for U.S. Appl. No. 13/733,828, 5 pages.
European Search Report for Application No. EP14000949, mailed on Jun. 4, 2014, 7 pages.
Hajto J., et al., "Electronic Switching in Amorphous-Semiconductor Thin Films", Chapter 14, 1992, pp. 640-701.
Hu X.Y., et al., "Write Amplification Analysis in Flash-based Solid State Drives", SYSTOR'09; 20090504 - 20090406, May 4, 2009, pp. 1-9.
International Search Report and Written Opinion for Application No. PCT/US2011/040362, mailed on Jan. 19, 2012, 1 pages.
International Search Report and Written Opinion for Application No. PCT/US2012/040232, mailed on Feb. 26, 2013, 7 pages.
International Search Report and Written Opinion for Application No. PCT/US2012/044077, mailed on Jan. 25, 2013, pages.
International Search Report and Written Opinion for Application No. PCT/US2012/045312, mailed on Mar. 29, 2013, 11 pages.
International Search Report and Written Opinion for Application No. PCT/US2013/042746, mailed on Sep. 6, 2013, 7 pages.
International Search Report and Written Opinion for Application No. PCT/US2013/054976, mailed on Dec. 16, 2013, 9 pages.
International Search Report for Application No. PCT/US2011/046036, mailed on Feb. 23, 2012, 3 pages.
Liu M., et al., "rFGA: CMOS-Nano Hybrid FPGA Using RRAM Components", IEEE CB3 N17International Symposium on Nanoscale Architectures, Anaheim, USA, Jun. 12-13, 2008, pp. 93-98.
Newman R.C., "Defects in Silicon," Reports on Progress in Physics, 1982, vol. 45, pp. 1163-1210.
Notice of Allowance mailed Sep. 4, 2014 for U.S. Appl. No. 13/761,132, 6 pages.
Notice of Allowance mailed Aug. 8, 2013 for U.S. Appl. No. 13/733,828, 9 pages.
Notice of Allowance mailed Apr. 9, 2013 for U.S. Appl. No. 13/748,490, 8 pages.
Corrected Notice of Allowability mailed Sep. 9, 2014 for U.S. Appl. No. 13/620,012, 2 pages.
Notice of Allowance mailed Sep. 9, 2014 for U.S. Appl. No. 13/870,919, 5 pages.
Notice of Allowance mailed Mar. 12, 2012 for U.S. Appl. No. 12/913,719, 5 pages.
Notice of Allowance mailed Nov. 13, 2013 for U.S. Appl. No. 13/461,725, 10 pages.
Notice of Allowance mailed Mar. 15, 2013 for U.S. Appl. No. 12/894,098, 12 pages.
Notice of Allowance mailed Mar. 17, 2014 for U.S. Appl. No. 13/592,224, 8 pages.
Notice of Allowance mailed Sep. 17, 2013 for U.S. Appl. No. 13/679,976, 8 pages.
Notice of Allowance mailed Sep. 17, 2014 for U.S. Appl. No. 13/960,735, 9 pages.
Notice of Allowance mailed Sep. 17, 2014 for U.S. Appl. No. 13/462,653, 7 pages.
Notice of Allowance mailed Sep. 18, 2012 for U.S. Appl. No. 12/900,232, 8 pages.
Notice of Allowance mailed Sep. 18, 2014 for U.S. Appl. No. 13/920,021, 8 pages.
Notice of Allowance mailed Sep. 18, 2014 for U.S. Appl. No. 13/586,815, 9 pages.
Notice of Allowance mailed Sep. 19, 2013 for U.S. Appl. No. 13/585,759, 8 pages.
Notice of Allowance mailed Mar. 20, 2014 for U.S. Appl. No. 13/598,550, 8 pages.
Notice of Allowance mailed Oct. 21, 2014 for U.S. Appl. No. 13/426,869, 11 pages.
Notice of Allowance mailed May 22, 2012 for U.S. Appl. No. 12/815,369, 10 pages.
Notice of Allowance mailed Sep. 25, 2014 for U.S. Appl. No. 13/447,036, 11 pages.
Notice of Allowance mailed Sep. 26, 2014 for U.S. Appl. No. 13/594,665, 9 pages.
Notice of Allowance mailed Aug. 27, 2014 for U.S. Appl. No. 13/077,941, 9 pages.
Notice of Allowance mailed Oct. 28, 2013 for U.S. Appl. No. 13/194,500, 13 pages.
Notice of Allowance mailed Oct. 28, 2013 for U.S. Appl. No. 13/651,169, 10 pages.

(56) References Cited

OTHER PUBLICATIONS

Notice of Allowance mailed Nov. 29, 2012 for U.S. Appl. No. 12/815,318, 8 pages.
Notice of Allowance mailed Sep. 30, 2013 for U.S. Appl. No. 13/481,696, 9 pages.
Notice of Allowance mailed Aug. 31, 2012 for U.S. Appl. No. 13/051,296, 8 pages.
Notice of Allowance mailed Oct. 8, 2014 for U.S. Appl. No. 13/077,941, 4 pages.
Office Action mailed Apr. 1, 2013 for U.S. Appl. No. 13/174,077, 15 pages.
Office Action mailed Aug. 2, 2013 for U.S. Appl. No. 13/594,665, 35 pages.
Office Action mailed Sep. 2, 2014 for U.S. Appl. No. 13/705,082, 41 pages.
Office Action mailed Oct. 3, 2013 for U.S. Appl. No. 13/921,157, 21 pages.
Office Action mailed Apr. 6, 2015 for U.S. Appl. No. 14/034,390, 27 pages.
Office Action mailed Dec. 6, 2013 for U.S. Appl. No. 13/564,639, 28 pages.
Chinese Office Action (English Translation) for Chinese Application No. 201110195933.7 dated Jul. 31, 2014, 4 pages.
Chinese Office Action (English Translation) for Chinese Application No 201110195933.7 dated May 18, 2015, 4 Pages.
Chinese Office Action (English Translation) for Chinese Application No. 201180050941.0 dated Apr. 3, 2015, 8 pages.
Chinese Office Action (English Translation) for Chinese Application No. 201180050941.0 dated Dec. 9, 2015, 5 pages.
Chinese Search Report (English Translation) for Chinese Application No. 201180050941.0 dated Mar. 25, 2015, 1 page
Chinese Office Action (with English Translation) for Chinese Application No. 201290000773.4 dated Jun. 9, 2014, 3 pages.
Chinese Office Action (English Translation) for Chinese Application No. 201280027066.9 dated Nov. 23, 2015, 5 pages.
Chinese Search Report (English Translation) for Chinese Application No. 201280027066.9 dated Nov. 13, 2015, 2 pages.
Shin W., et al., "Effect of Native Oxide on Polycrystalline Silicon CMP," Journal of the Korean Physical Society, 2009, vol. 54 (3), pp. 1077-1081.
Notice of Allowance dated Sep. 14, 2016 for U.S. Appl. No. 14/588,202, 119 pages.
Notice of Allowance dated Oct. 5, 2016 for U.S. Appl. No. 14/887,050, 113 pages.
Notice of Allowance dated Oct. 17, 2016 for U.S. Appl. No. 14/213,953, 43 pages.
Office Action for U.S. Appl. No. 14/194,499 dated May 18, 2016, 10 pages.
Office Action for U.S. Appl. No. 14/207,430 dated Oct. 15, 2015, 57 pages.
Office Action for U.S. Appl. No. 14/207,430 dated Mar. 10, 2016, 78 pages.
Office Action for U.S. Appl. No. 14/207,430 dated Jul. 25, 2016, 79 pages.
Office Action for U.S. Appl. No. 14/213,953 dated Nov. 9, 2015, 20 pages.
Office Action for U.S. Appl. No. 14/383,079 dated May 10, 2016, 7 pages.
Office Action for U.S. Appl. No. 14/383,079 dated Aug. 4, 2015, 11 pages.
Office Action for U.S. Appl. No. 14/588,202 dated May 10, 2016, 8 pages.
Office Action for U.S. Appl. No. 14/588,202 dated Sep. 11, 2015, 9 pages.
Office Action for U.S. Appl. No. 14/613,301 dated Feb. 4, 2016, 42 pages.
Office Action for U.S. Appl. No. 14/613,301 dated Mar. 31, 2015, 58 pages.
Office Action for U.S. Appl. No. 14/613,301 dated Jul. 31, 2015, 26 pages.
Office Action for U.S. Appl. No. 14/887,050 dated Mar. 11, 2016, 12 pages
Office Action for U.S. Appl. No. 15/046,172 dated Apr. 20, 2016, 8 pages
Office Action mailed Mar. 6, 2013 for U.S. Appl. No. 13/174,264 filed Jun. 30, 2011.
Office Action dated Aug. 12, 2016 for U.S. Appl. No. 14/667,346, 27 pages.
Office Action mailed Dec. 3, 2015 for U.S. Appl. No. 14/253,796.
Office Action dated Aug. 23, 2016 for U.S. Appl. No. 14/613,585, 9 pages.
Office Action mailed Apr. 15, 2016 for U.S. Appl. No. 14/597,151.
Office Action mailed Jun. 17, 2014 for U.S. Appl. No. 14/072,657 filed Nov. 5, 2013.
Office Action mailed Mar. 17, 2015 for U.S. Appl. No. 14/573,770.
Office Action mailed Sep. 20, 2013 for U.S. Appl. No. 13/481,600 filed May 25, 2012.
Office Action mailed Jan. 25, 2012 for U.S. Appl. No. 12/861,650 filed Aug. 23, 2010.
Office Action mailed Oct. 25, 2012 for U.S. Appl. No. 13/461,725, filed May 1, 2012.
Office Action mailed Apr. 8, 2016 for U.S. Appl. No. 14/573,770.
Office Action mailed May 20, 2016 for U.S. Appl. No. 14/613,299.
Office Action mailed Jul. 9, 2015 for U.S. Appl. No. 14/573,817.
Office Action dated Aug. 12, 2016 for U.S. Appl. No. 14/613,301, 43 pages.
Chinese Office Action (with English Translation) for Chinese Application No. 201280027066.9 mailed on Jul. 4, 2016, 5 pages.
Chou S.Y., et al., "Imprint Lithography With 25-Nanometer Resolution," Science, 1996, vol. 272, pp. 85-87.
Corrected Notice of Allowability dated Nov. 20, 2014 for U.S. Appl. No. 13/594,665, 5 pages.
Corrected Notice of Allowability dated Jun. 15, 2016 for U.S. Appl. No. 13/952,467, 10 pages.
European Office Action for Application No. 11005649.6 dated Dec. 1, 2014, 2 pages.
European Office Action for Application No. 11005649.6 dated Nov. 17, 2015, 5 pages.
European Search Report for Application No. EP11005207.3 mailed on Oct. 12, 2011.
Final Office Action dated Jun. 29, 2016 for U.S. Appl. No. 14/692,677, 21 pages.
Final Office Action for U.S. Appl. No. 14/612,025 dated Jun. 14, 2016, 7 pages.
Final Office Action mailed Feb. 1, 2016 for U.S. Appl. No. 14/573,817.
Final Office Action mailed May 20, 2016 for U.S. Appl. No. 14/253,796.
Final Office Action mailed Aug. 13, 2014 for U.S. Appl. No. 13/525,096 filed Jun. 15, 2012.
Jafar M., et al., "Switching in Amorphous-silicon Devices," Physical Review, 1994, vol. 49 (19), pp. 611-615.
Jo S H et al "Nanoscale Memristive Devices for Memory and Logic Applications", Ph. D Dissertation, University of Michigan, 2010.
Notice of Allowance dated Nov. 26, 2013 for U.S. Appl. No. 13/481,696, 15 pages.
Notice of Allowance dated Dec. 16, 2014 for U.S. Appl. No. 12/835,704, 47 pages.
Notice of Allowance dated Dec. 19, 2014 for U.S. Appl. No. 13/529,985, 9 pages.
Notice of Allowance dated Jul. 1, 2016 for U.S. Appl. No. 14/213,953, 96 pages.
Notice of Allowance dated Jul. 17, 2014 for U.S. Appl. No. 12/861,432, 25 pages.
Notice of Allowance dated Aug. 28, 2015 for U.S. Appl. No. 14/573,770, 23 pages.
Notice of Allowance for U.S. Appl. No. 14/509,967 dated Feb. 17, 2016, 18 pages.
Notice of Allowance for U.S. Appl. No. 14/509,967 dated Jun. 6, 2016, 96 pages.
Notice of Allowance for U.S. Appl. No. 14/213,953 dated Feb. 16, 2016, 21 pages.

(56) References Cited

OTHER PUBLICATIONS

Notice of Allowance for U.S. Appl. No. 14/612,025 dated Jul. 22, 2015, 25 pages.
Notice of Allowance for U.S. Appl. No. 13/912,136 dated Aug. 3, 2015, 15 pages.
Notice of Allowance for U.S. Appl. No. 13/952,467 dated May 20, 2016, 19 pages.
Notice of Allowance for U.S. Appl. No. 14/027,045 dated Jun. 9, 2015, 14 pages.
Notice of Allowance for U.S. Appl. No. 14/383,079 dated Jan. 4, 2016, 27 pages.
Notice of Allowance for U.S. Appl. No. 14/588,202 dated Jan. 20, 2016, 15 pages.
Notice of Allowance for U.S. Appl. No. 14/887,050 dated Jun. 22, 2016, 13 pages.
Notice of Allowance for U.S. Appl. No. 14/946,367 dated Jul. 13, 2016, 23 pages.
Notice of Allowance mailed Sep. 9, 2014 for U.S. Appl. No. 13/870,919 filed Apr. 25, 2013.
Notice of Allowance mailed Jan. 11, 2016 for U.S. Appl. No. 14/613,299.
Notice of Allowance mailed Jan. 20, 2016 for U.S. Appl. No. 14/034,390.
Notice of Allowance mailed Jan. 11, 2013 for U.S. Appl. No. 12/894,087 filed Sep. 29, 2010.
Notice of Allowance mailed Jan. 16, 2014 for U.S. Appl.No. 13/921,157 filed Jun. 18, 2013.
Notice of Allowance mailed May 17, 2013 for U.S. Appl. No. 13/290,024.
Notice of Allowance mailed Apr. 2, 2013 for U.S. Appl. No. 13/149,757 filed May 31, 2011.
Notice of Allowance mailed Feb. 10, 2015 for U.S. Appl. No. 13/525,096 filed Jun. 15, 2012.
Notice of Allowance mailed Mar. 20, 2014 for U.S. Appl. No. 13/461,725, filed May 1, 2012.
Notice of Allowance mailed Dec. 23, 2015 for U.S. Appl. No. 14/573,770.
Notice of Allowance mailed Apr. 20, 2016 for U.S. Appl. No. 14/573,817.
Notice of Allowance mailed Aug. 26, 2015 for U.S. Appl. No. 14/034,390.
Notice of Allowance mailed Sep. 8, 2015 for U.S. Appl. No. 14/613,299.
Office Action dated Dec. 31, 2015 for U.S. Appl. No. 14/692,677, 27 pages.
Office Action dated Feb. 5, 2015 for U.S. Appl. No. 14/027,045, 6 pages.
Office Action dated Apr. 11, 2014 for U.S. Appl. No. 13/594,665, 44 pages.
Office Action dated Apr. 6, 2015 for U.S. Appl. No. 13/912,136, 23 pages.
Office Action for U.S. Appl. No. 14/612,025 dated Feb. 1, 2016, 12 pages.
Office Action for U.S. Appl. No. 13/952,467 dated Jan. 15, 2016, 22 pages.
Japanese Office Action mailed on Aug. 9, 2016 for Japanese Application No. 2014-513700, 8 pages (including translation).
Chinese Office Action mailed on Sep. 1, 2016 for Chinese Application No. 201380027469.8, 8 pages (including translation).
Office Action for U.S Appl. No. 14/597,151 dated Oct. 20, 2016, 52 pages.
Notice of Allowance for U.S. Appl. No. 14/509,967 dated Oct. 24, 2016, 42 pages.
Notice of Allowance for U.S. Appl. No. 14/612,025 dated Oct. 19, 2016, 108 pages.
Notice of Allowance for U.S. Appl. No. 14/383,079 dated Aug. 17, 2016, 71 pages.
Notice of Allowance for U.S. Appl. No. 15/046,172 dated Oct. 4, 2016, 116 pages.
Notice of Allowance for U.S. Appl. No. 13/952,467 dated Sep. 28, 2016, 128 pages.
Office Action for U.S. Appl. No. 14/588,136 dated Nov. 2, 2016, 132 pages.
Notice of Allowance for U.S. Appl. No. 14/692,677 dated Nov. 21, 2016, 97 pages.
Corrected Notice of Allowability dated Dec. 6, 2016 for U.S. Appl. No. 14/383,079, 33 pages.
Notice of Allowance for U.S. Appl. No. 14/194,499 dated Dec. 12, 2016, 125 pages.

* cited by examiner

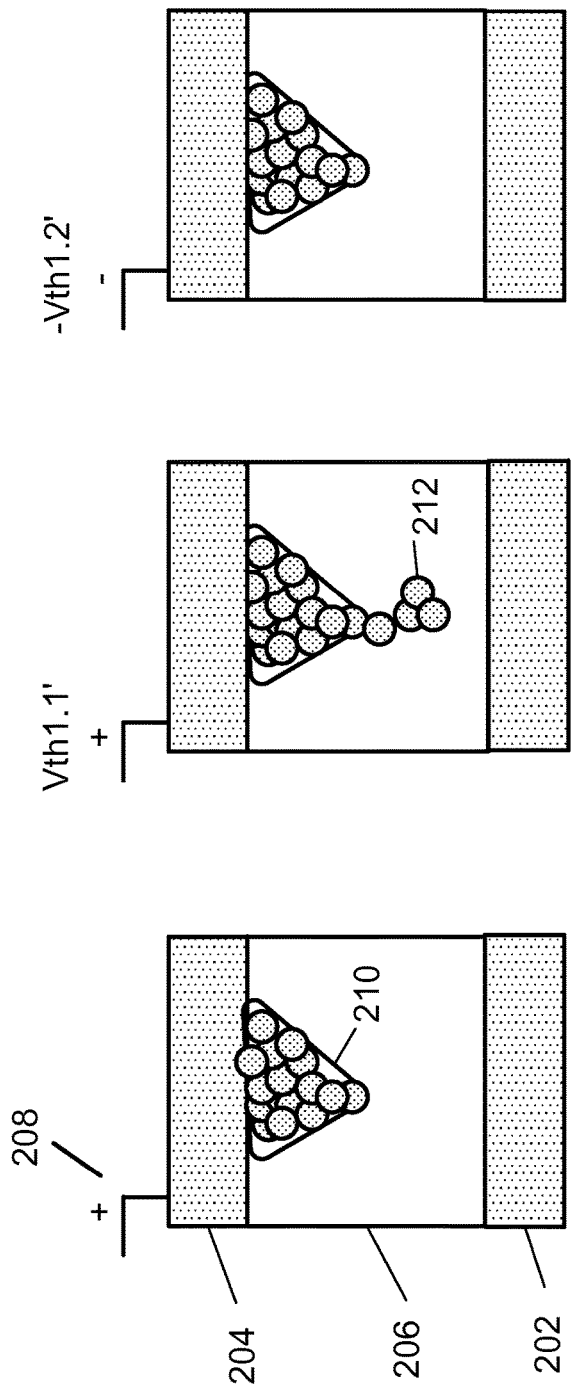
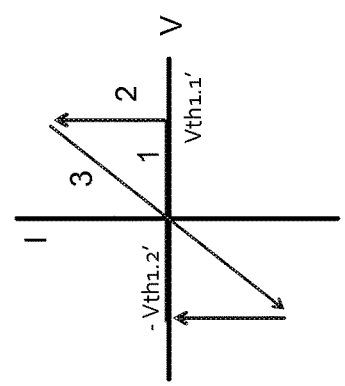
Fig. 2
Fig. 2A

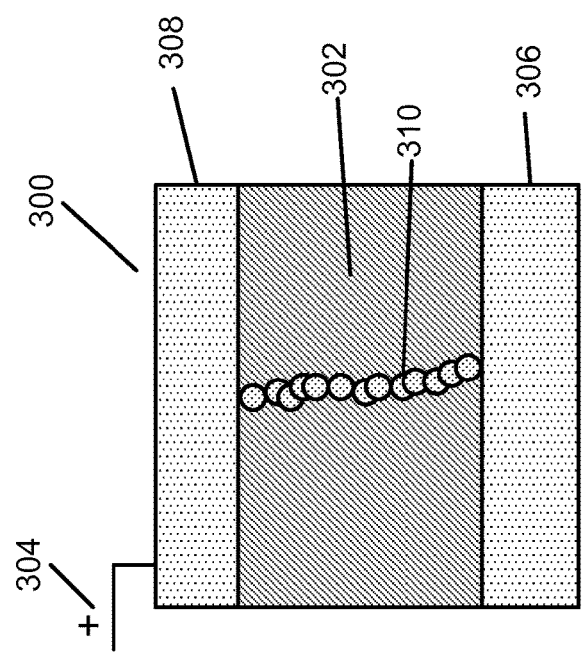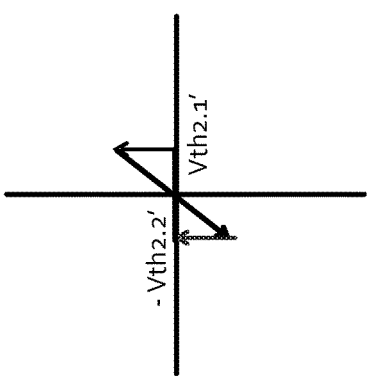
Fig. 3
Fig. 3A

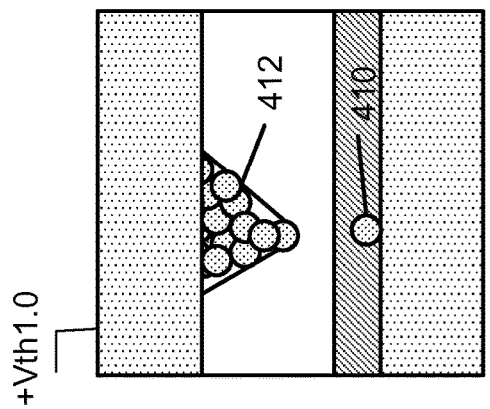
Fig. 4
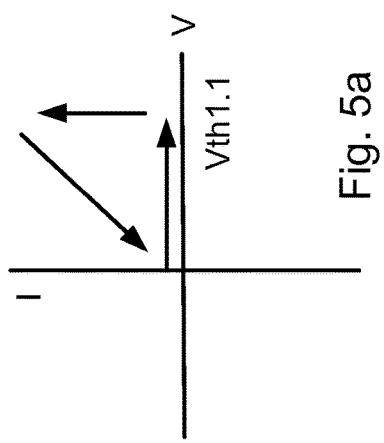
Fig. 4a
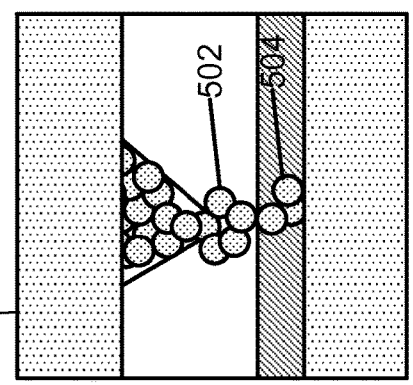
Fig. 5
Fig. 5a

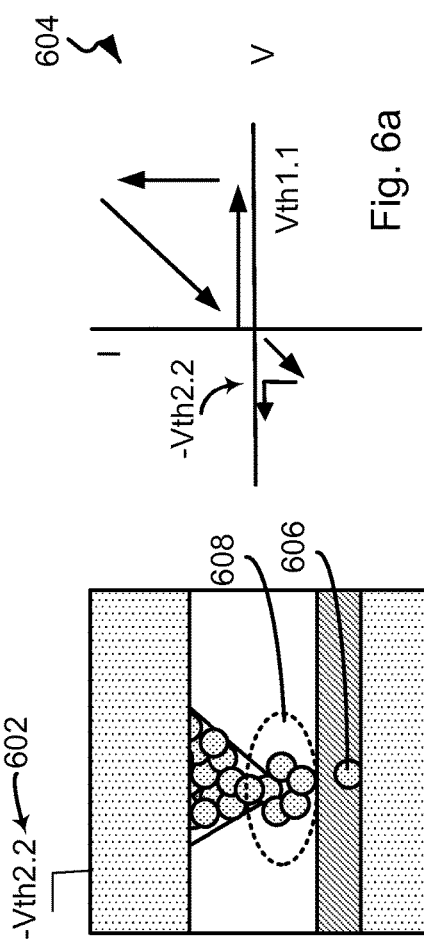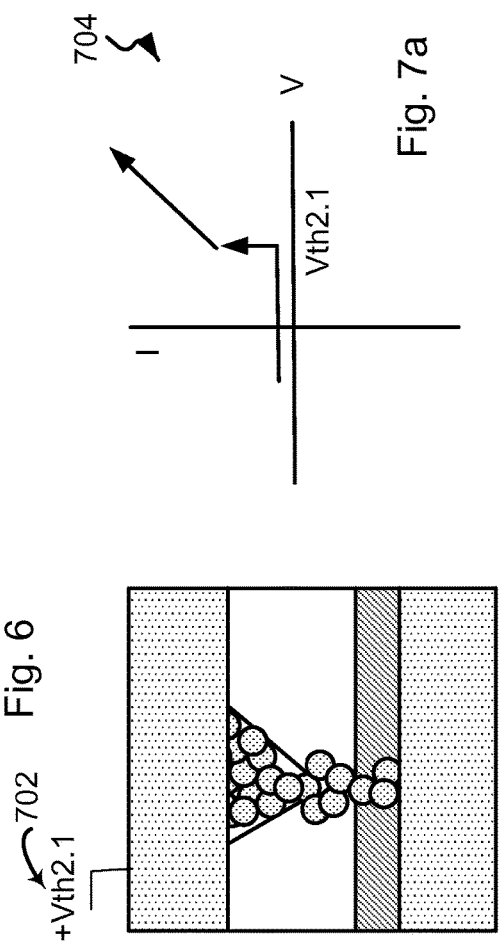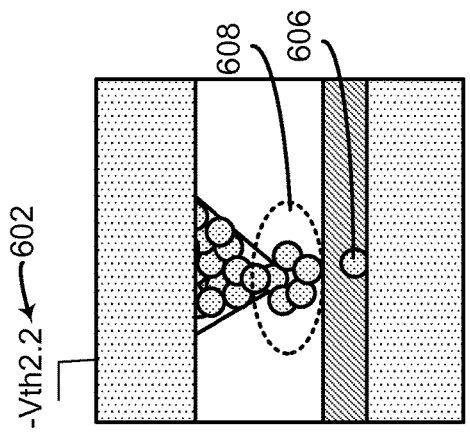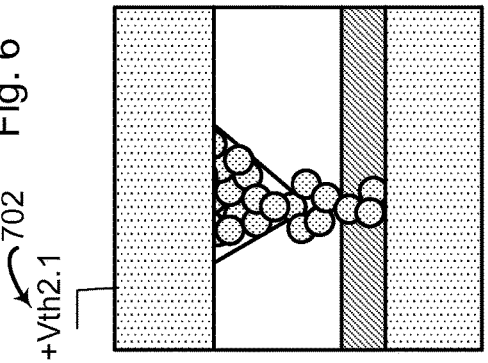

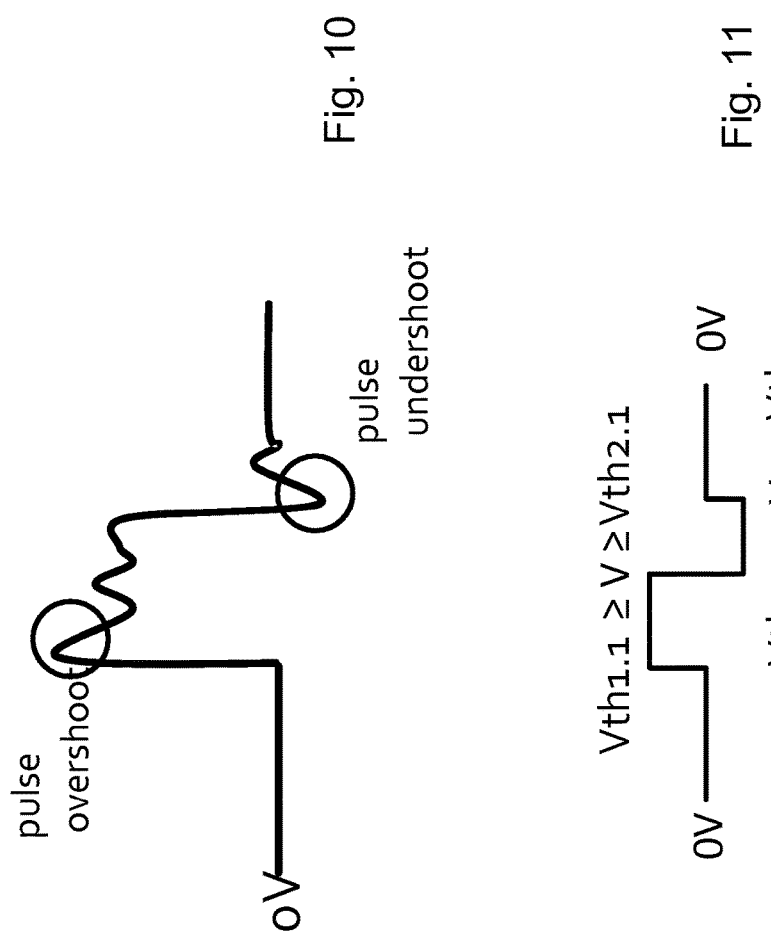

HETERO-SWITCHING LAYER IN A RRAM DEVICE AND METHOD

CROSS REFERENCE TO RELATED APPLICATIONS

This application is a continuation-in-part of U.S. application Ser. No. 13/920,021 filed Jun. 17, 2013, now U.S. Pat. No. 8,947,908, to be issued on Feb. 3, 2015, which is a continuation-in-part of U.S. application Ser. No. 13/290,024, filed Nov. 4, 2011, now U.S. Pat. No. 8,467,227 issued Jun. 18, 2013, which is a non-provisional of U.S. Application No. 61/410,035, filed Nov. 4, 2010. U.S. application Ser. No. 13/920,021 filed Jun. 17, 2013 also claims priority to and is a continuation-in-part of U.S. application Ser. No. 13/585,759, filed Aug. 14, 2012, now U.S. Pat. No. 8,569,172 issued Oct. 29, 2013; U.S. Application No. 61/712,171, filed Oct. 10, 2012; and U.S. application No. 61/786,100, filed Mar. 15, 2013. This application also claims priority to and is a continuation-in-part of U.S. application Ser. No. 12/835,704 filed Jul. 13, 2010; U.S. patent application Ser. No. 14/509,967 filed Oct. 8, 2014 that claims priority to and is a continuation of U.S. application Ser. No. 12/861,432 filed Aug. 23, 2010, now U.S. Pat. No. 8,884,261, issued Nov. 11, 2014; and U.S. patent application Ser. No. 14/573,817 filed Dec. 17, 2014 that claims priority to U.S. application Ser. No. 13/462,653 filed May 2, 2012, now U.S. Pat. No. 8,946,046, to be issued on Feb. 3, 2015. The above applications are herein by incorporated by reference, for all purposes.

STATEMENTS RELATED TO FEDERAL OR GOVERNMENT SPONSORED RESEARCH

Not Applicable

BACKGROUND

The present invention is related to switching devices. More particularly, the present invention provides a resistive switching device characterized by a controllable programming current with faster operation speed. Embodiments of the present invention have been applied to fabrication and operation of a resistive random access memory device. But it should be recognized that the present invention can have a much broader range of applicability.

The success of semiconductor devices has been mainly driven by an intensive transistor down-scaling process. However, as field effect transistors (FET) approach sizes less than 100 nm, problems such as short channel effect can degrade device performance. Moreover, such sub 100 nm device size can lead to sub-threshold slope non-scaling and also increases power dissipation. It is generally believed that transistor-based memories such as those commonly known as Flash may approach an end to scaling within a decade.

Other non-volatile random access memory devices such as ferroelectric RAM (Fe RAM), magneto-resistive RAM (MRAM), organic RAM (ORAM), and phase change RAM (PCRAM), among others, have been explored as next generation memory devices. These devices often require new materials and device structures to couple with silicon-based devices to form a memory cell, which lack one or more key attributes. For example, FeRAM and MRAM devices have fast switching characteristics and good programming endurance, but their fabrication is not CMOS compatible and size is usually large. Switching for a PCRAM device requires a high power. Organic RAM is incompatible with large volume silicon-based fabrication and device reliability is usually poor. Desirable attributes of a high density device should include high switching speed, reliable switching, and high endurance, among others.

From the above, a new semiconductor device structure and integration is desirable.

BRIEF SUMMARY OF THE PRESENT INVENTION

The present invention is directed to switching device. More particularly, the present invention is directed to a resistive switching device having more than one switching material to enhance performance of the resistive switching device. For example, the resistive switching device can include a first switching material for switching and a second material for suppressing leakage current when an operating voltage is applied. Embodiments according to the present invention can be particularly useful for a non-volatile memory device in an interconnected device array. It should be recognized, however, that embodiments according to the present invention can have a much broader range of applicability.

In a specific embodiment, a non-volatile memory device structure is provided. The non-volatile memory device includes a first electrode, a second electrode, and a resistive switching material stack sandwiched between the first electrode and the second electrode. In a specific embodiment, the resistive switching material stack overlies the first electrode. The resistive switching material stack includes a first resistive switching material and a second resistive switching material. In a specific embodiment, the second switching material overlying the first electrode and the first switching material overlying the second switching material. In a specific embodiment, the first switching material is characterized by a first switching voltage having a first amplitude. The second resistive switching material is characterized by a second switching voltage having a second amplitude no greater than the first switching voltage. In a specific embodiment, the second electrode includes at least a metal material overlying the first switching material, and physically and electrically in contact with the first resistive switching material.

In a specific embodiment, a method for writing to a resistive switching device is provided. The method includes providing a resistive switching device. The resistive switching device includes a first electrode, a switching material stack comprising a first switching material and a second switching material, and a second electrode. In a specific embodiment, the second switching material overlies the first electrode, the first switching material overlies the second switching material, and the second electrode comprising at least a metal material overlies the first switching material. The first switching material is characterized by a first switching voltage having a first amplitude. The second switching material is characterized by a second switching voltage. In a specific embodiment, the first amplitude is greater than the second amplitude. In a specific embodiment, the method includes applying a first voltage to the second electrode to cause the first switching material to change from a first high resistance state to a first low resistant state.

In a specific embodiment, a method for erasing of a resistive switching device after write is provided. The method includes providing a resistive switching device in a write state. The resistive switching device includes a first electrode, a switching material stack comprising a first switching material and a second switching material, and a second electrode. In a specific embodiment, the second switching material overlies the first electrode, the first switching material overlies the second switching material, and the second electrode comprising at least a metal material overlies the first switching material. The first switching material is characterized by a first switching voltage having a first amplitude. The second switching material is characterized by a second switching voltage. In a specific embodiment, the first amplitude is greater than the second amplitude. In a specific embodiment, the write state is caused at least by a low resistance state of the first switching material. The method includes applying a first voltage more negative than an erase voltage of the first resistive switching material to cause at least the first switching material to be in a first high resistance state and to cause the resistive switching device to change from the write state to an erased state.

In a specific embodiment, a method to read a state of a resistive switching device is provided. The method includes providing a resistive switching device. The resistive switching device includes a first electrode, a switching material stack comprising a first switching material and a second switching material, and a second electrode. In a specific embodiment, the second switching material overlies the first electrode, the first switching material overlies the second switching material, and the second electrode comprising at least a metal material overlies the first switching material. The first switching material is characterized by a first switching voltage having a first amplitude. The second switching material is characterized by a second switching voltage. In a specific embodiment, the first amplitude is greater than the second amplitude. The method includes applying a read voltage to the second electrode, the read voltage is configured to cause the second switching material to change from a first high resistance state to a first low resistance state while maintaining a resistance state of the first switching material. The method includes determining a read current flowing in the resistive switching device to determine the state of the resistive switching device in a specific embodiment.

In a specific embodiment, a method for suppressing a leak current in a resistive switching device is provided. The method includes providing a resistive switching device. The resistive switching device includes a first electrode, a switching material stack comprising a first switching material and a second switching material, and a second electrode. In a specific embodiment, the second switching material overlies the first electrode, the first switching material overlies the second switching material, and the second electrode comprising at least a metal material overlies the first switching material. The first switching material is characterized by a first switching voltage having a first amplitude. The second switching material is characterized by a second switching voltage. In a specific embodiment, the first amplitude is greater than the second amplitude. The method includes applying a first voltage to the second electrode, the first voltage being configured to cause the second switching material to be at a high resistance state and maintaining the first switching material to be at a low resistance state, the high resistance state suppressing a leak current from applying the first voltage.

In a specific embodiment, a non-volatile memory device structure is provided. The non-volatile memory device structure includes a first electrode configured to extend in a first direction. The non-volatile memory device structure includes a first structure configured to extend in a first direction. In a specific embodiment, the first structure includes a stack of switching material spatially configured to extend in a second direction at an angle to the first direction. In a specific embodiment, the stack of switching material includes a first switching material overlying the first electrode. The first switching material includes a solid electrolyte material in a specific embodiment. The stack of switching material includes a second switching material overlying the first switching material. In a specific embodiment, the second switching material includes an amorphous silicon material in a specific embodiment. The non-volatile memory device structure further includes a second electrode comprising at least a portion comprising a metal material in contact with the amorphous silicon material in a specific embodiment.

In a specific embodiment, a non-volatile memory device structure is provided. The non-volatile memory device structure includes a first structure spatially configured to extend in a first direction. In a specific embodiment, the first structure includes a first electrode, a solid electrolyte material overlying the first electrode and an amorphous silicon material overlying the solid electrolyte material. The non-volatile memory device structure includes a second electrode spatially configured to extend in a second direction at an angle to the first direction. In a specific embodiment, the second electrode includes at least a first portion directly in contact with the amorphous silicon material and a second portion for an interconnect structure.

In a specific embodiment, a non-volatile memory device structure is provided. The non-volatile memory device structure includes a first electrode spatially configured to extend in a first direction, a second electrode spatially configured to extend in a second direction perpendicular to the first direction, and a first structure disposed in an intersection region formed between the first electrode and the second electrode. In a specific embodiment, the first structure includes a solid electrolyte material overlying the first electrode and an amorphous silicon material overlying the solid electrolyte material. In a specific embodiment, the second electrode includes at least a metal material in direct contact with the amorphous silicon material.

Additional aspects include a method of reading a resistive switching device in a crossbar array, comprising: providing a first switching device, a second switching device, a third switching device, and a fourth switching device, the first switching device being in a first resistance state, each of the first switching device, the second switching device, the third switching device, and the fourth switching device comprising at least a first switching material and a second switching material, the first switching material being characterized by a first on voltage and a first off voltage and the second switching material being characterized by a second on voltage and a second off voltage, the first on voltage being greater than the second on voltage, the first off voltage being greater than the second off voltage; applying a read voltage to the first switching device, the read voltage being configured to maintain the second switching material of at least one of the second switching device, the third device and the fourth device to be at a high resistance state, the high resistance state suppressing a leakage current from at least one of the second switching device, the third device and the fourth device to flow in the first switching device; and measuring a read current in the first switching device caused by the read voltage to determine the first resistance of the first switching device.

Additional aspects include the method of above wherein the first on voltage causes the first switching material to change from a first high resistance state to a first low resistance state and the first off voltage causes the first switching material to change from the first low resistance state to a first high resistance state.

Additional aspects include the method of above wherein the second on voltage causes the second switching material to change from a second high resistance state to a second low resistance state and the second off voltage causes the second switching material to change from the second low resistance state to a second high resistance state.

Additional aspects include the method of above wherein the read voltage is configured to be greater than the second on voltage and no greater than three times the second first on voltage to maintain the second switching material of at least one of the second switching device, the third device and the fourth device to be at the high resistance state.

Additional aspects include a non-volatile memory device structure comprising: a first electrode configured to extend in a first direction; and a first structure comprising a stack of material spatially configured to extend in a second direction at an angle to the first direction, the stack of material comprising: a solid electrolyte material overlying the first electrode; an amorphous silicon material overlying the solid electrolyte material; and a second electrode comprising at least a portion comprising a metal material in contact with the amorphous silicon material.

Additional aspects include a non-volatile memory device structure comprising: a first structure spatially configured to extend in a first direction, the first structure comprising: a first electrode; a solid electrolyte material overlying the first electrode; an amorphous silicon material overlying the solid electrolyte material; and a second electrode spatially configured to extend in a second direction at an angle to the first direction, the second electrode comprising at least a first portion directly in contact with the amorphous silicon material and a second portion for an interconnect structure.

Additional aspects include a non-volatile memory device structure comprising: a first electrode spatially configured to extend in a first direction; a second electrode spatially configured to extend in a second direction, the second direction being perpendicular to the first direction; and a first structure disposed in an intersection region formed between the first electrode and the second electrode, the first structure comprising: a solid electrolyte material overlying the first electrode; an amorphous silicon material overlying the solid electrolyte material.

Additional aspects include a method for suppressing a leak current in a resistive switching device, comprising: providing a resistive switching device, the resistive switching device comprising a first electrode, a switching material stack comprising a first switching material and a second switching material, the second switching material overlying the first electrode, the first switching material overlying the second switching material, and a second electrode comprising at least a metal material overlying the first switching material, the first switching material being characterized by a first switching voltage, the second switching material being characterized by a second switching voltage, the first switching voltage being characterized by a first amplitude and the second switching device being characterized by a second amplitude, the first amplitude being greater than the second amplitude; and applying a first voltage to the second electrode, the first voltage being configured to cause the second switching material to be at a high resistance state and maintaining the first switching material to be at a low resistance state, the high resistance state suppressing a leak current from applying the first voltage.

Additional aspects includes a method according to the above wherein the first voltage is no greater than an on voltage for the first switching material and less negative than an off voltage for the second switching material.

Many benefits can be achieved by ways of the present invention. Embodiments according to the present invention provide a device structure to form a non-volatile memory device that has leakage current suppressed or eliminated, which is essential for a crossbar array of memory cells. The device structure further provides desirable characteristics for write, read, and erase and allowing fabrication of a memory device having a high on state current and desirable data retention characteristic. Additionally, the present device uses materials and techniques that are compatible with current CMOS processing. Depending on the embodiment, one or more of these benefits may be achieved. One skilled in the art would recognize other variations, modifications, and alternatives.

SUMMARY OF THE DRAWINGS

FIG. 2 is a simplified diagram illustrating mechanism of switching for a first switching device.

FIG. 2A is a simplified current versus voltage characteristic of the first switching device.

FIG. 3 is a simplified diagram illustrating mechanism of switching for a second switching device.

FIG. 3A is a simplified current versus voltage characteristic of the second switching device.

FIGS. 4, 4a 5, 5a, 6, 6a, 7, 7a, 8, 8a are simplified diagrams illustrating mechanism of switching for a switching device according to embodiments of the present invention.

FIG. 10 illustrates short voltage pulse for read of the switching device and corresponding voltage versus current characteristic according to an embodiment of the present invention.

FIG. 11 is a simplified voltage versus current plot illustrating leakage current suppression in the switching device according to an embodiment of the present invention.

DETAILED DESCRIPTION OF THE PRESENT INVENTION

The present invention is directed to switching device. More particularly, the present invention is directed to a resistive switching device having more than one switching material to enhance performance of the resistive switching device. For example, the resistive switching device can include a first switching material for switching and a second material for suppressing leakage current when an operating voltage is applied. Embodiments according to the present invention can be particularly useful for a non-volatile memory device in an interconnected device array. It should be recognized that embodiments according to the present invention can have a much broader range of applicability.

High density and low cost storage devices are in ever increasing demand due to the growth in consumer devices common in the market place. Current non-volatile memory devices including Flash are probably at an end to further scaling due to fundamental limitations in the devices. It is predicted that current charge storage in a floating gate or a dielectric material in Flash may not be possible in device size less that about 10 nm. A new category of devices using an interconnected crossbar configuration that are vertically integrated in a three dimensional manner can have a high device density not achievable in current memory devices.

However, leakage current from a cell in an interconnected crossbar array can form a sneak path in the array. A sneak path is a current path for leakage current from one cell to propagate in an array of cells. The leakage current can interfere with proper operations (read write, or erase) in all the cells in the sneak path. To suppress the leakage current and to isolate a cell from the leakage current, a rectifier can be used. The rectifier adds complexity to the device design and could be difficult to integrate in a crossbar array. Certain devices may have rectifying behavior but such devices usually have a symmetrical IV characteristic, which does not work well in a crossbar array. Other cells may have a low on state current and thus have poor data retention properties.

Additionally, to exploit the advantage for vertically stacking of cells, controlling CMOS devices are usually first formed on a substrate and the memory arrays are subsequently fabricated above the CMOS devices. Processing temperature of the memory cells should not be greater than 500 Degree Celsius to ensure proper functioning of the CMOS devices. Embodiments of the present invention provide a device structure and related methods to form a resistive switching device that is rectifying and processing parameters that are compatible with current CMOS device processing technologies.

Figure 1:
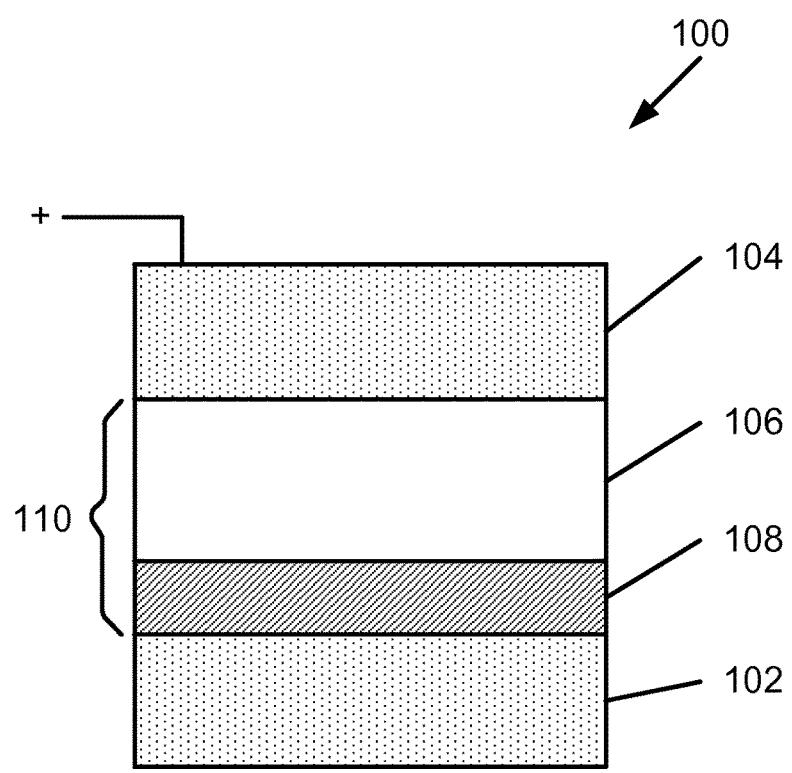
FIG. 1 is a simplified diagram illustrating a device structure for a resistive switching device according to an embodiment of the present invention.

Referring to FIG. 1. A resistive switching device structure 100 according to an embodiment of the present invention is provided. The device structure includes a first electrode 102, a second electrode 104, and a switching material stack 110 disposed in between the first electrode and the second electrode. The switching material stack includes a first resistive switching material 106 overlying a second resistive switching material 108.

First electrode material can be a suitable metal material including alloy materials, or a semiconductor material having a suitable conductivity characteristic. In one specific embodiment, the first electrode can be a semiconductor material having a suitable electrical conducting property. For example, the first electrode may include a conductive silicon-bearing material, such as doped (e.g. P-type) polysilicon material, a doped silicon-containing layer, a doped silicon germanium material, and the like. The first electrode can also be a first metal material including alloy materials such as those commonly used in CMOS processing, a combination of metal and doped silicon-containing material, or the like. Examples of the first metal material are copper, tungsten, or aluminum, and other suitable metal materials. In various embodiments, these metal materials may be deposited using a physical vapor deposition process, chemical vapor deposition process, electroplating, or electroless deposition process, including any combinations of these, and others.

In certain embodiments, one or more adhesion layers or diffusion layers may be disposed below the first metal material and/or above the first metal material to reduce contamination of metal material into other portions of the device. Diffusion barrier material or adhesion material may each include titanium, titanium nitride, tungsten, tungsten nitride, tantalum, tantalum nitride, titanium tungsten, or combinations of these materials. The semiconductor material can be a doped polysilicon material depending on the implementation.

Depending on the application, the second electrode 104 has at least a portion that includes a metal material in direct contact with the first switching material. In a specific embodiment, the metal material can include a material including metal particles of silver, gold, platinum, palladium, nickel, aluminum, and others. In some embodiments, mixtures of the material may include other compounds besides the metal particles, for example, the metal particles may be part of an alloy with other metals or non-metals.

The metal material has a desirable characteristic in the first switching material and the second switching material, for example, diffusion, oxidation and reduction, and others.

In various embodiments, the second electrode can also be a second metal material such as those commonly used in CMOS processing such as copper, tungsten, or aluminum, and other suitable metal materials. One or more adhesion layers may be disposed below the second metal material and/or above the second metal material. For example, an adhesion layer/barrier layer may include tungsten nitride, titanium, titanium nitride, tantalum, tantalum nitride, or combinations of these films.

In a specific embodiment, the first switching material is configured to determine a switching characteristic and retention characteristic of the resistive switching device and the second switching material is configured to control leakage current in the resistive switching device. In some embodiments, the first switching material is an undoped amorphous silicon material an intrinsic semiconductor, a non-stoichiometric material, such as a silicon sub-oxide, or the like. The switching material used is usually a non-conductive material having defect sites or grain boundaries allowing a plurality of metal particles from the second metal electrode to form a metal region therein when a voltage is applied to the second electrode or the first electrode. In some embodiments, the switching material may include a metal oxide, or the like.

In a specific embodiment, the polysilicon material allows for controlling and improving switching properties of the amorphous silicon switching material. For other switching materials, such as metal oxide, or other non-conductive material having defect sites or grain boundaries or non-stoichiometric sites, such as a silicon sub-oxide, other contact material may be used, or the contact layer may not be needed. Of course, one skilled in the art would recognize other variations, modifications, and alternatives.

In a specific embodiment, the first switching material can be an amorphous semiconductor and/or sub-oxide material such as Si, Ge, $Si_xGe_y$, $SiO_x$ and $Si_xGe_yO_z$. It should be understood that any such sub-oxide refers to a non-stoichiometric oxide. An example of this is silicon oxide: stoichiometric silicon oxide is $SiO2$, and non-stoichiometric oxide may be $SiOx$ where $0<x<2$. In various embodiments, other forms of non-stoichiometric oxide may be formed or grown using various fabrication techniques. The amorphous material and/or suboxide is characterized by a switching voltage ranging from about 1.0 to about 4 volts, 1.5 volts to about 4 volts, or the like, depending on the process condition. In various embodiments, the composition of the first switching material layer may be non-uniform. For example, SiOx in an upper region of a resistive switching material layer and SiOy in a lower region, where $0<y<x<2$, or the like.

As merely an example, the second switching material can be a solid electrolyte material. The solid electrolyte material can include be chalcogenide based such as $Ge_xS_y$, $Ge_xSe_y$, $SbxTe_y$, $Ag_xSe_y$, and $Cu_xS_y$, or can be metal oxide based such as $WO_x$, $TiO_x$, $AlO_x$, $HfO_x$, $CuO_x$, and $TaO_x$, where 0<x<appropriate stoichiometric value (e.g. 2, 3, etc.) (e.g. GeS, GeSe, $WO_3$, or SbTe, and the like). The solid electrolyte material can have a first switching voltage ranging from about 0.1 volt to about 1.0, about 0.1 volt to about 0.5 volt, or the like depending on the solid electrolyte material. The solid electrolyte material further provides a temperature advantage in processing, as the deposition temperature is generally less than about 400 Degree Celsius. For example, $Ge_xS_y$, $Ge_xSe_y$ (e.g. GeS, GeSe) and $SbxSe_y$ (e.g. SbSe) can be deposited using a sputtering process performed at about room temperature. $WO_x$ (e.g. $WO_3$) can be formed by oxidation of tungsten metal, a common material used in COMS processing, at a temperature of about 400 Degree Celsius or less. $TiO_x$, $AlO_x$, and $HfO_x$ can be deposited using a sputtering or an ALD (atomic layer deposition) process at lower than 400 Degree Celsius. As metal material such as copper or silver has a high diffusivity in the solid electrolyte material, the first switching voltage is small and write voltage is generally lower than erase voltage for the solid electrolyte material (for example, $Ge_xSe_y$ (e.g. GeSe) has a write voltage of about 0.4 volt and an erase voltage of about −0.2 volt). In various embodiments, an additional barrier material layer may be disposed between first switching material 106 and metal material 104. This barrier material layer may provide a barrier against undesired contaminants from affecting first switching material 106, or the like. In some embodiments, the barrier material may include titanium, titanium oxide, tungsten, or the like.

FIG. 2 illustrates switching characteristic of the first switching device using amorphous silicon material as the switching material. The first switching device includes a first electrode 202, a second electrode 204, and an amorphous silicon material 206 disposed in between the first electrode and the second electrode. The second electrode has at least a portion that includes a metal material in a specific embodiment. The metal material can be silver, gold, platinum, palladium, nickel, aluminum, and others. As shown, when a positive voltage 208 greater than a first threshold voltage is applied to the second electrode of an as fabricated device, a metal region 210 is formed in a portion of the amorphous silicon material and causes the first switching device to be in a high resistance state or an off state. The formation of the metal region in the amorphous silicon material is a diffusion process assisted by an electric field upon application of the positive voltage to the second electrode. Specifically, the metal region is formed from neutral metal particles that are derived from the second electrode and are located in defect sites of the switching material. The metal region includes a first filament structure 212, which expands or retracts depending on an amplitude and polarity of voltage applied. To write into the switching device, a write voltage +Vth1.1 is applied, causing the first filament structure to extend. The amorphous silicon material is in a low resistance state and the first switching device is at an on state and an on state current flows in the amorphous silicon material. In various embodiments, the write voltage is a positive voltage applied to the second electrode and can range from about 1 to 6 volts depending on the process conditions of the amorphous silicon material, among others. For a switching device using only amorphous silicon material as switching material, rectification is possible for a low on state current (for example, less than about 2 u amp). However, in some configurations, filament structure is not stable at low on state current, and data retention is therefore poor.

Repeatable resistive switching can be provided by formation or deformation of the filament structure within the switching material. For instance, the repeatable resistive switching can be in response to application, and subsequent variation, of a voltage to the two terminal resistive switching device. As one example, the device can be switching from a high resistance state, e.g., off, to a low resistance state, e.g., on, when the voltage is increased beyond a certain threshold voltage (e.g., a filament formation voltage). The device can be switched from the low resistance state to the high resistance state, e.g., off, when the voltage is decreased lower than a second threshold voltage. In some embodiments, a voltage between the certain threshold voltage and the second threshold voltage can cause a current resistance state of the device to remain unchanged (and utilized, e.g., to read the current resistance state of the device).

In one or more disclosed embodiments, a positive voltage applied to the top wiring structure can generate an electric field(s) causing particles of conductive material (ions) to form and diffuse within the switching material. The particles of conductive material can form a structure (e.g., a filament) extending at least in part across a switching material when the positive voltage is removed. Under suitable circumstances (e.g., application of the positive voltage or the electric field(s)), the filament creates an electrical pathway across switching material, resulting in the low resistance state mentioned above. In additional embodiments, a suitable negative voltage applied to the top wiring structure can generate a second electric field(s) that at least in part deforms the filament. Deformation of the filament can interrupt the electrical pathway across switching material, resulting in the high resistance state.

FIG. 2A illustrates switching behavior of the first switching device using amorphous silicon material as the switching material. As shown, the first switching device has a first forward switching threshold or a first write voltage of Vth1.1 and a first erase voltage of −Vth1.2 and Vth1.1>>|Vth1.2|, that is the first erase voltage is lower that the first write voltage in absolute terms.

As shown in a simplified diagram in FIG. 3, switching behavior of a second switching device 300 using a solid electrolyte 302 as a switching material is illustrated. The second switching device includes a first electrode 306 and a second electrode 308. As shown, when a positive voltage 304 is applied to second electrode 308, a second filament structure 310 is formed in the solid electrolyte material. The second filament structure may be formed by a chemical reaction, for example, a reduction/oxidation reaction when the positive voltage is applied. The second filament structure forms a conductive path in the solid electrolyte material and causes a second low resistance state in the solid electrode material. A negative voltage applied to the second electrode would break or cause discontinuity in the second filament structure and the solid electrolyte material reverts back to a high resistive state.

FIG. 3A illustrates a switching behavior of the second switching device using solid electrolyte material as the switching material. The second switching device has a second forward switching threshold or a second write voltage of Vth2.1 and a second erase voltage of −Vth2.2 and Vth2.1>>|Vth2.2|, that is the second erase voltage is lower that the second write voltage in absolute terms In addition, |Vth1.x|>>|Vth2.x|, where x=1 or 2, that is operating voltages (write, erase or read) of the first switching device (using amorphous silicon as switching material) is configured to be greater than operating voltages of the second switching device using solid electrolyte material as switching device.

FIG. 4-8 illustrate operations of a switching device comprising two switching materials according to an embodiment of the present invention. As shown, an as fabricated device 400 is provided. The as fabricated device includes a first electrode 402, a switching material stack comprises of a first switching material 404 and a second switching material 406. The first switching material overlies the second switching material, and a second electrode 408 overlies the first switching material, as shown. In a specific embodiment, the first electrode can include a first metal material. The first metal material can be tungsten, copper, or aluminum or a conductor material commonly used in CMOS processing depending on the application. The first switching material includes an amorphous silicon material and the second switching material includes a solid electrolyte in a specific embodiment. The second electrode has at least a portion that includes a metal material in direct contact with the first switching material. In a specific embodiment, the metal material can be silver, copper, nickel, gold, palladium, aluminum or other suitable metals having a desirable diffusivity characteristic in the first switching material and the second material in a specific embodiment.

Referring again to FIG. 4, when a voltage greater than a first threshold voltage Vth1.0 for the amorphous silicon material is applied, a first metal region 410 is formed in a portion of the solid electrolyte material and a second metal region 412 is formed in a portion of the amorphous silicon material. First metal region 410 is characterized by a first filament structure and a first length. The first filament structure includes a series of metal particles to provide a conductive path in the solid electrolyte material. In a specific embodiment, second metal region 412 further includes a second filament structure characterized by a second length. In a specific embodiment, the first length and the second length depend on an operating voltage and respective switching voltage of each of the amorphous silicon material and the solid electrolyte material. The switching device is now at an initial off state in which the amorphous silicon material is in a first high resistance state and a first off state. The solid electrolyte material is in a second high resistance state or a second off state.

To write into the switching device, a second voltage greater than about a write voltage Vth1.1 for the amorphous silicon material is applied. The second filament structure in the amorphous silicon material extends 502. As the write voltage for the solid electrolyte material is lower, the second voltage would turn on both amorphous silicon material and the solid electrolyte and a third filament structure 504 is formed in the solid electrolyte material as shown in FIG. 5. The switching device is now being written in which the amorphous silicon material is in a first low resistance state and a first on state and the solid electrolyte material is in a second low resistance state or a second on state. This is only a transient state during writing. A corresponding I-V representation 504 is also shown in FIG. 5.

FIG. 6 is a simplified diagram illustrating a first erase cycle after writing when a fourth voltage more negative than a first erase voltage for the solid electrolyte material −Vth2.2 is applied. Corresponding I-V curve 604 is also shown. The third filament structure in the solid electrolyte material retracts and the solid electrolyte is back to the high resistance state. The fourth voltage is not high enough to cause the amorphous silicon to be in a low resistance state and the second filament structure 608 remains extended in the amorphous silicon material. In this instant, the amorphous silicon is in the on state or written state while the solid electrolyte material is in the off state or erase state and the device remains in a written state or on state.

To turn on the solid electrolyte material after it is in the off state (for example, as in FIG. 6), only a small voltage, greater than about Vth2.1 is needed to turn the solid electrolyte into a low resistance state or an on state. This is illustrated in FIG. 7. As shown, when a voltage greater than about Vth2.1 is applied, while the amorphous silicon in at a low resistant state, a voltage greater than about Vth2.1 causes the solid electrolyte material to be in a low resistant state. Now both the amorphous silicon material and the solid electrolyte material are in their respective low resistance states, the resistive switching device is now again being written.

Figures 8, 8A:
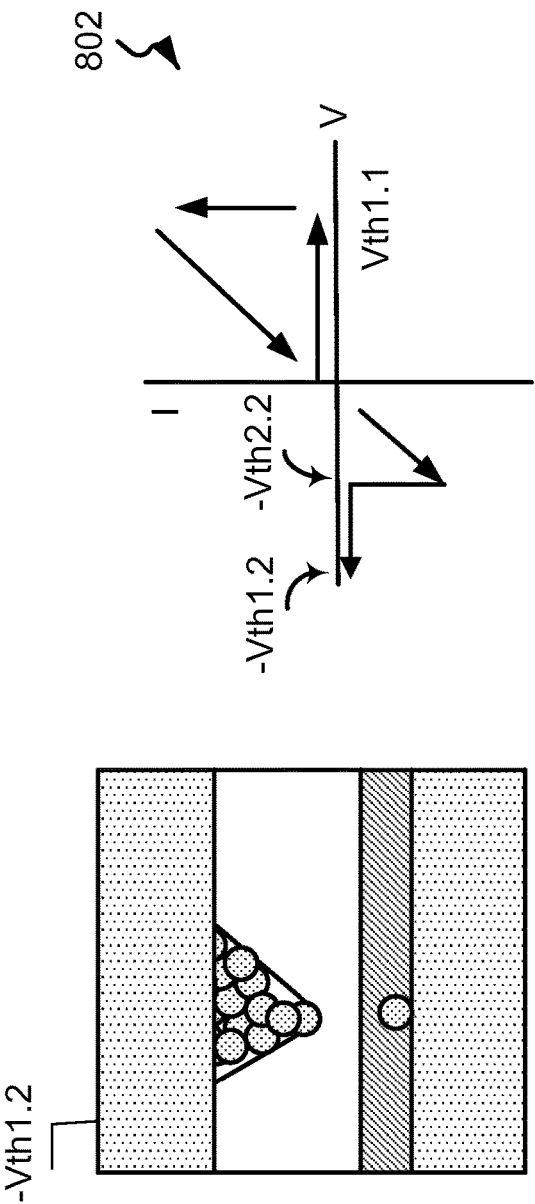

FIG. 8 illustrate an erase operation of the resistive switching device according to an embodiment of the present invention. The device starts at a written state as in FIG. 5. As shown in FIG. 5, both the solid electrolyte material and the amorphous silicon material are at their respective on states or low resistance states. A negative voltage having an amplitude greater than Vth1.2 would cause the first metal structure in the solid electrolyte material and the metal filament structure in the amorphous silicon material to retract. Now, both the amorphous silicon material and the sold electrolyte material are in their respective high resistance states and the resistive switching device is at an off state. Therefore, from FIGS. 4-8, in some embodiments, the amorphous silicon material is written first and can be erased after the solid electrolyte has been erased.

In a specific embodiment, a device state of the resistive switching device is determined by a state of the amorphous silicon material. That is the resistive switching device is at an on state if the amorphous silicon material is at an on state or a low resistance state. The device is in an off state if both the amorphous silicon material and the solid electrolyte material are in their respective high resistance states. During a write process, a voltage greater than +Vth1.1 would cause both the amorphous silicon material and the solid electrolyte to be in a low resistance state.

To determine a state of the device during a read process, a read voltage is applied. The read voltage can be in a range between +Vth2.1 and +Vth1.1, so that the read voltage would not turn on the amorphous silicon material if it is at a high resistance state or the device in at an off state. If the device is at an on state, the read voltage between +Vth2.1 and +Vth1.1 would merely measure the state of the device.

In one embodiment, in an ideal situation, during a write process, only the amorphous silicon material is caused to be at an on state, and during an erase cycle, only the amorphous silicon material is caused to be at an off state. However, this is not possible as the solid electrolyte has a lower on voltage and a lower off voltage than the amorphous silicon material, and would be turned on at the on voltage of the amorphous silicon material and would be turned off at the off voltage of the amorphous silicon material. Therefore, in a write cycle, a voltage greater than Vth1.1 would cause both the amorphous silicon material and the solid electrolyte material to be in their respective on states. A subsequent voltage between −Vth2.2 and −Vth1.2 would only turn off the solid electrolyte material and the device is at on state with only the amorphous silicon material being at on state.

Figure 9:
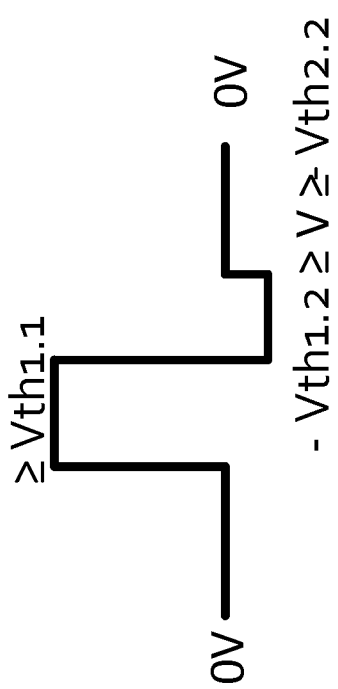
FIG. 9 is a simplified diagram illustrating voltage pulse for turning on the switching device according to an embodiment of the present invention.

In one embodiment, during a read process, if the device is at an on state, the amorphous silicon material is at an on state or at a low resistance state, the read voltage would only turn on the solid electrolyte material. The solid electrolyte is turned off after the read process using a voltage between −Vth2.2 and −Vth1.2. If the device is at an off state, only the solid electrolyte material would be turned on and the amorphous silicon material would remained at the off state, so that the read voltage would not turn on the amorphous silicon material and only determines the state of the device. An illustration is shown in a voltage pulse diagram in FIG. 9.

The state (on or off) of a device should not be altered by a read voltage. In cases where short voltage pulses are applied for a read process, voltage rises or falls in a short duration to reduce a pulse width. Voltage overshoot or undershoot can occur as shown in FIG. 10. If the device is at an off state, voltage overshoot may cause a write process in the amorphous silicon material if the amorphous silicon material is at an off state, a voltage undershoot could cause an erase process in the solid electrolyte material. Therefore, to use a short voltage pulse for read, a voltage greater that the on voltage for the solid electrolyte material (Vth2.1) is first applied. In some embodiments, if the device is in an on state, the device would be turned on by the on voltage for the solid electrolyte material. An erase voltage greater than the erase voltage for the solid electrolyte material is then applied. Alternatively, the read voltage pulse can have an amplitude between the write voltage of the solid electrolyte material and the write voltage of the amorphous silicon material followed by an erase voltage between the erase voltage of the amorphous silicon material and the erase voltage of the solid electrolyte material to ensure that the device state would not be altered in the read process.

In a specific embodiment, leakage current in the device can be suppressed during a read process as illustrated in the I-V characteristic in FIG. 11. For example, for an on state device, the amorphous silicon material is at an on state or low resistance state. Leakage current in the device is suppressed if the solid electrolyte material is at a high resistance state. Therefore, a read voltage between the erase voltage (−Vth1.2) of the amorphous silicon material and the write voltage of the solid electrolyte material (Vth2.1) would suppress leakage current. That is, the read voltage applied should be no greater than +Vth2.1 to prevent turning on the solid electrolyte material to cause leakage current (of the unselected cells), and the read voltage should not be more negative than −Vth1.2 so that the on state of the amorphous silicon is maintained (of the unselected cells).

Figure 12:
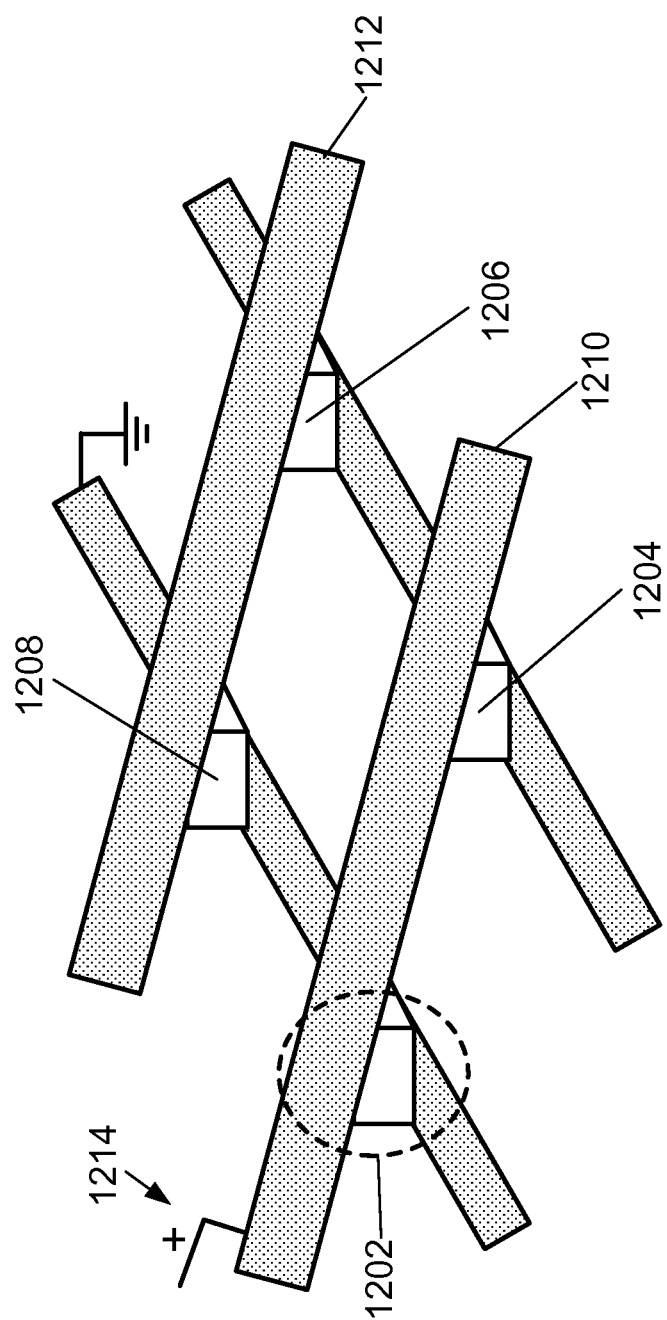
FIG. 12 is a simplified diagram illustrating a crossbar array of switching devices according to an embodiment of the present invention.

Embodiments according to the present invention further provide a method to suppress leakage current in an array, for example in an interconnected crossbar array, to prevent erroneous reading of a state of a target cell. A sneak path for leakage current can include at least three cells coupled to the target cell in the crossbar array as shown in FIG. 12. As merely an example, a first cell 1202, a second cell 1204, a third cell 1208, and a fourth cell 1206 in a crossbar array are provided. Each of the first cell, the second cell, the third cell, and the fourth cell has a two layer switching material configuration as shown in FIG. 1. The two layer switching material includes an amorphous silicon as the first switching material and a solid electrolyte as the second switching material. As merely an example, the first cell is the target cell for read. As shown, the second cell 1204 and the first cell 1202 share a common first electrode 1210, and the third cell 1208 and the fourth cell 1206 share a common second electrode 1212. The fourth cell 1206 is indirectly connected to the first cell 1202 through the second cell 1204 and the third cell 1208. To determine the state of the first cell, a forward biased voltage 1214 for read is applied on common first electrode 1210, as shown, to the first cell 1202 and a read current is measured. This would cause the second cell 1204 and the third cell 1208 to be forward biased as they are electrically connected to the first cell, the fourth cell 1206 would remain reverse bias since it is not directly connected to the first cell.

If the second cell 1204, the third cell 1208, and the fourth cell 1206 are each at on state, that is, the amorphous silicon material in all three cells are at low resistant state, the leakage current (e.g. via 1203, 1206 and 1208) would be most severe if no rectification is provided. In various embodiments, there are again two possibilities for each of the on state cells: the solid electrolyte material in each of the three cells (e.g. 1204, 1206, 1208) can be at on state or off state. For a first case where the solid electrolyte material in each of the three cells (1204, 1206, 1208) are at off state or high resistance state, if the read voltage is no greater than three times the write voltage of the solid electrolyte material, the solid electrolyte material (of cells 1204, 1206 and 1208) would not be turned on, no leakage current would be allowed to flow in the target cell. However, a read voltage should be greater than the write voltage for the solid electrolyte material to determine the state of the target cell. Accordingly, to read the state of a target cell, the read voltage should be greater than the write voltage of the solid electrolyte material of the target cell but no greater than three times the write voltage of the solid electrolyte material:

$$Vth2.1 < V\text{ read} < 3Vth2.1$$

As a device state (on or off) depends only on the state of the amorphous silicon material and independent of the state of the solid electrolyte material, a single voltage pulse is used to turn on or turn off the amorphous silicon material and therefore the device. Of course other variations, modifications, and alternatives exist and would be obvious to one skilled in the art.

Consider again the case where all the cells (e.g. 1204, 1206, 1208) in the sneak path (e.g. via 1204, 1206, 1208) are at on state, and both the amorphous silicon material and the solid electrolyte in the cells in the sneak path are at on state or low resistance state. To prevent leakage current to affect the target cell (1202) during read, a forward read voltage (1214) greater than three times Vth2.2, or three times the erase voltage of the solid electrolyte material is first applied, the solid electrolyte material in the reversed biased cell (for example, the fourth cell 1206 in FIG. 4) in the sneak path will be erased and resistance in the reversed biased cell increases. Once the reversed biased cell is erased, the voltage drop across the reversed biased cell decreases and the solid electrolyte material in other cells in the sneak path are erased and the erase at a higher speed, in ns usually. Once the solid electrolyte material in the reversed biased cell is erased, the sneak path is blocked, as the cells are in a higher resistance state and the resistance of the target cell (1202) can be measured. As the magnitude of the erase voltage (Vth2.2) is usually smaller than the magnitude of write voltage (Vth2.1) for the solid electrolyte material, the forward biased cells (second cell 1204 and the third cell 1208) in the sneak path would not be affected.

Since the amorphous silicon material and the solid electrolyte material both have a high resistance at off state, more than one method and device structure may be used to fabricate a crossbar array of the resistive switching device having desired rectification characteristics, among others. The resistive switching materials can be formed as a part of the first electrode, or as a part of the second electrode, or as a switching element formed in an intersection region of the first electrode and the second electrode.

Figure 13:
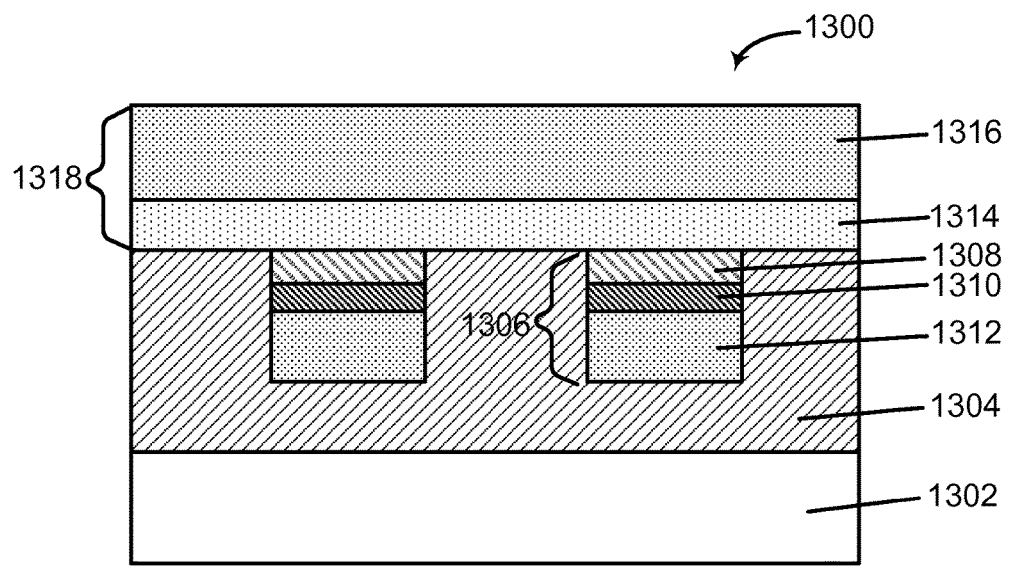
FIG. 13-15 are simplified diagrams illustrating various device structures for fabricating a switching device for implementing in a crossbar array according to embodiments of the present invention.

FIG. 13 is a simplified diagram illustrating a first device structure and a method for fabricating a resistive switching device using more than one switching materials according to an embodiment of the present invention is provided. The method includes providing a substrate 1302 having a surface region. The substrate can be a suitable semiconductor material such as single crystal silicon wafer, a silicon on insulator (commonly called SOI), or a silicon germanium material depending on the application. In a specific embodiment, the substrate can include one or more transistor devices (e.g. CMOS transistor devices) formed thereon. The one or more transistors provide control circuitry for the resistive switching device in a specific embodiment. In other embodiments, the devices may include logic, processing circuitry, or the like. A first dielectric material 1304 is formed overlying the surface region of the semiconductor substrate. The first dielectric material can be silicon oxide, silicon nitride, a high K dielectric material, a low K dielectric material, or a combination, depending on the application.

In a specific embodiment, the method includes depositing a first electrode material overlying the first dielectric material. The first electrode material can be tungsten, copper or aluminum and further includes one or more diffusion barrier or adhesion layer depending on the electrode material used.

In a specific embodiment, the method includes depositing a first switching material overlying the first electrode material. The first switching material is characterized by a first resistance depending on a first switching voltage applied to the device. In a specific embodiment, the first switching material can be a solid electrolyte material. The solid electrolyte material can be WO3, GeSe, GeS, SbTe, and the like. The first switching material can be deposited using a sputtering process from a suitable target material. For WO3 as the first switching material, the WO3 can be formed by oxidation of a tungsten electrode in a specific embodiment. Oxidation temperature can be at about 300 Degree Celsius or lower, compatible to CMOS processing. The solid electrolyte material has a switching voltage ranging from about 0.5 volt to about 1.5 volts depending on the material.

In a specific embodiment, a second switching material is deposited overlying the first switching material. The second switching material is characterized by a second resistance depending on a second switching voltage. The second switching material is configured to have a second switching voltage of second amplitude higher than that of the first switching material in a specific embodiment. The second switching material can be an amorphous silicon material in a specific embodiment. Depending on the process conditions, the amorphous silicon material can have a switching voltage ranging from about 1 volt to about 4 volts.

The method subjects the second switching material, the first switching material, and the first electrode material to a first pattern and etch process to form a first structure 1306. The first structure includes the second switching material 1308, the first switching material 1310, and the first electrode material 1312 and configured in an elongated shape and spatially oriented in a first direction in a specific embodiment. In a specific embodiment, a second dielectric material is formed overlying the first structure and spaces between the first structures. The second dielectric material is planarized to isolate each of the first structures in a specific embodiment. The first structure includes an exposed surface region of the second switching material in a specific embodiment.

The method includes forming a second electrode material overlying the first structure. The second electrode material has a first portion 1314 that includes a metal material in a specific embodiment. The metal material is in direct contact with the second switching material in a specific embodiment. The metal material is characterized by a suitable mobility and diffusivity in the first switching material and the second switching material in a specific embodiment. The second electrode material further includes a second portion 1316 that forms a wiring structure for the resistive switching device in a specific embodiment. For amorphous silicon material as the second switching material, the metal material can include silver, gold, palladium, copper, aluminum, nickel and the likes.

In a specific embodiment, the second electrode material is subjected to a third pattern and etch process to form a second electrode structure. The second electrode structure is elongated in shape and spatially disposed in a second direction at an angle to the first direction. In a specific embodiment, the first electrode structure and the second electrode structure are orthogonal to each other to form a crossbar structure. The first switching material and the second switching material are disposed in an intersecting region formed by the first electrode structure and the second electrode structure in a specific embodiment.

Figure 14:
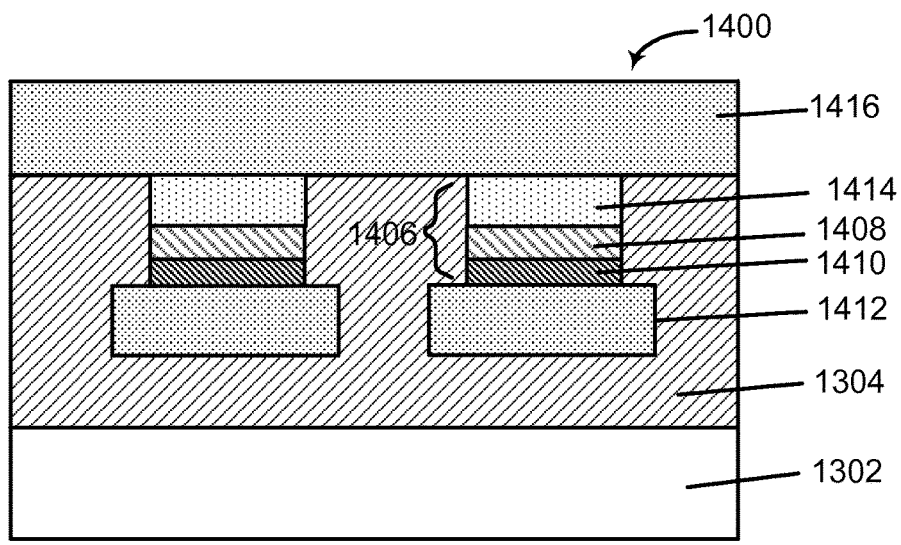

Depending on the embodiment, there can be variations to the method of forming the resistive switching device as illustrated in FIG. 14. In a specific embodiment, the method includes forming a first electrode structure 1412 in a portion of the first dielectric material 304. The first electrode structure 1412 is elongated in shape and spatially extended in a first direction in a specific embodiment. The first electrode structure can be formed by first depositing an electrode material overlying the first dielectric material followed by a first pattern and etch process. The first electrode material can be tungsten, copper or aluminum and further includes one or more diffusion barrier or adhesion layer depending on the electrode material used. A second dielectric material is formed overlying the first electrode structure and filling gaps between the first electrode structures. The second dielectric material is subjected to a planarizing process to expose a surface region of the first electrode structure and to isolate the first electrode structure in a specific embodiment.

Alternatively, the first electrode structure can be formed by a damascene process. The damascene process includes formed an opening structure in the first dielectric material by a second pattern and etch process. The first electrode material including the one or more diffusion barrier or adhesion layer is formed to fill the opening structure and a thickness overlying the first dielectric material. The method then performs a planarization process to remove the first thickness of first electrode material overlying the first dielectric material to isolate the first electrode material in the opening structure in a specific embodiment. The first electrode structure is configured in an elongated manner and extends in a first direction in a specific embodiment.

In a specific embodiment, the method forms a first switching material comprising a solid electrolyte material 1410 overlying the first electrode structure and a second switching material 1408 overlying the first switching material. A metal material 1414 is formed overlying the second switching material. Similar to the device structure in FIG. 13, the first switching material 1410 comprises a solid electrolyte material and the second switching material comprises an amorphous silicon material. The metal 1414 can include silver, gold, palladium, copper, aluminum, nickel and the like. Silver material in and the respective dielectric material depend on the way the first electrode structure is formed. The second switching material 1408 comprising an amorphous silicon material is formed overlying the first switching material. The method subjects the first switching material, the second switching material, and the metal material to a third pattern and etch process to form a plurality of pillar structures 1406. As shown, each of the pillar structures includes the first switching material, the second switching material, and the metal material in a specific embodiment. Each of the pillar structures are formed overlying at least a portion of the first electrode structure and maintain an electrical contact with the first electrode structure in a specific embodiment.

The method includes forming a third dielectric material overlying each of the pillar structures. The third dielectric material is planarized to expose a surface region of the metal material and to isolate each of the pillar structures in a specific embodiment. A second electrode material is deposited overlying the metal material and the planarized third dielectric material in a specific embodiment. The second electrode material has a first portion that include the metal material selected from silver, gold, palladium, copper, aluminum, nickel and the likes for amorphous silicon material as the second switching material. The second electrode material further includes a second portion 1416 for a second wiring structure for the switching device in a specific embodiment. The second electrode material is subjected to a fourth pattern and etch process to form a second electrode structure overlying the at least the second switching material and the third dielectric material. In a specific embodiment, the second electrode structure is configured to extend in a second direction at an angle to the first angle. In a preferred embodiment, the second electrode is configured orthogonal to the first electrode structure.

Figure 15:
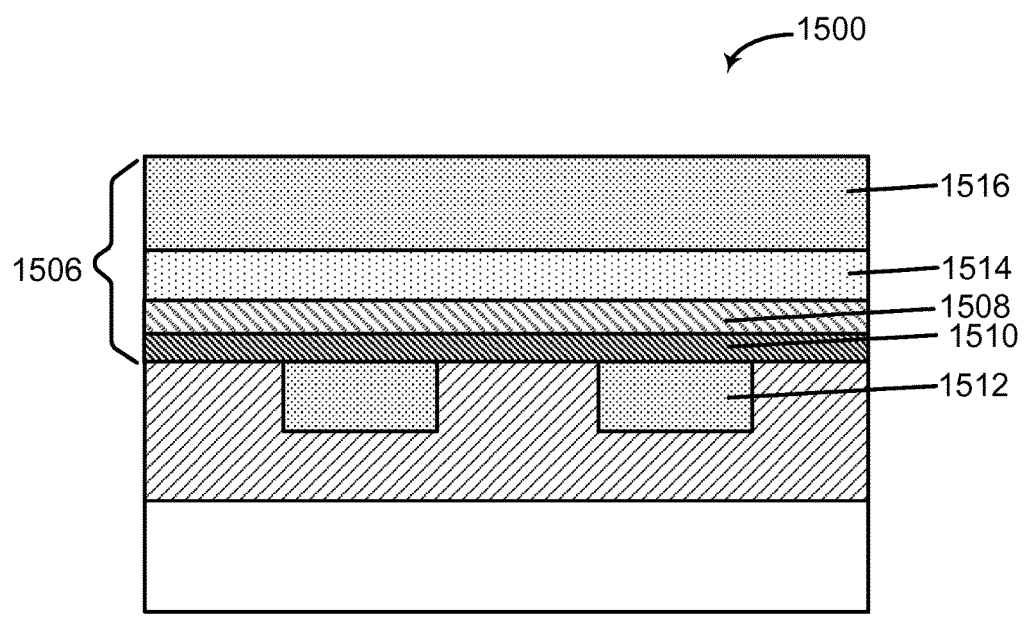

Depending on the application there can be other variations as shown in a simplified diagram in FIG. 15. Embodiment in FIG. 15 forms a first electrode structure 1512 spatially disposed in a first direction. A second structure 1506 comprising the first switching material 1508, the second switching material 1510, the metal material 1514, and the second electrode material 1516 is formed overlying at least the first electrode structure 1512. In a specific embodiment, the second structure is elongated in shape and spatially configured in a second direction orthogonal to the first direction in a specific embodiment.

Accordingly, examples in FIGS. 13, 14, and 15 illustrate ways to form a crossbar array of switching devices using more than one switching material according to embodiments of the present invention. The switching device has desirable properties to form a crossbar array of devices, for example rectifying, good retention characteristics, among others. Of course one skilled in the art would recognized other variations, modifications, and alternatives.

Though the present invention has been described using various examples and embodiments, it is also understood that the examples and embodiments described herein are for illustrative purposes only and that various modifications or alternatives in light thereof will be suggested to persons skilled in the art and are to be included within the spirit and purview of this application and scope of the appended claims.

What is claimed is:

1. A semiconductor device comprising:
   a substrate;
   a first plurality of electrodes disposed upon the substrate, wherein each electrode from the first plurality of electrodes comprises a metal containing material;
   a plurality of resistive switching devices disposed overlying the plurality of first electrodes, wherein each resistive switching device from the plurality of resistive switching devices comprises a first resistive switching material, a second resistive switching material, and at least an active metal material, wherein the first resistive switching material is disposed overlying the first electrode, wherein the second resistive switching material is disposed overlying and contacting the first resistive switching material, wherein the active metal material is disposed overlying the second resistive switching material, wherein the first resistive switching material is characterized by a first switching voltage having a first amplitude, wherein the second resistive switching material is characterized by a second switching voltage having a second amplitude, and wherein the first amplitude is less than the second amplitude;
   a second plurality of electrodes disposed above the plurality of resistive switching devices, wherein each electrode from the second plurality of electrodes comprises the metal material, and wherein each electrode from the second plurality of electrodes is disposed overlying and electrically coupled to the active metal material of the resistive switching devices from the plurality of resistive switching devices.

2. The device of claim 1 wherein the metal containing material in each electrode from the first plurality of electrodes comprises particles of metal selected from a group consisting of: copper, tungsten, aluminum;
   wherein each electrode from the first plurality of electrodes also comprises a barrier material selected from a group consisting of titanium, titanium nitride, tungsten, tungsten nitride, tantalum, tantalum nitride, and titanium tungsten; and
   wherein the first resistive switching material is disposed overlying and contacting the barrier material.

3. The device of claim 1 wherein the metal containing material in each electrode from the plurality of electrodes comprises particles of copper metal; and
   wherein each electrode from the first plurality of electrodes includes tantalum nitride.

4. The device of claim 1 wherein the first resistive switching material is configured to maintain a high resistance state until after the first switching voltage is applied, after which the first resistive switching material is configured to enter a low resistance state.

5. The device of claim 1 wherein the first resistive switching material is characterized by the first switching voltage having the first amplitudes within a range of about 0.1 volts to about 1 volt.

6. The device of claim 1 wherein the first resistive switching material comprises a solid electrolyte.

7. The device of claim 1 wherein the first resistive switching material is selected from a group consisting of: a chalcogenide, a metal oxide, GeS, GeSe, W03, SbTe, GexSy, GexSey, SbxTey, AgxSey, CuxSy, WOx, TiOx, AlOx, HfOx, CuOx, and TaOx, where 0<x<appropriate stoichiometric value, and where 0<y<appropriate stoichiometric value.

8. The device of claim 7 wherein the second resistive switching material is characterized by the second switching voltage having the second amplitude within a range of about 1.5 volts to about 4 volts.

9. The device of claim 1 wherein the active metal material comprises metal particles selected from a group consisting of: gold, platinum, palladium, aluminum, and nickel.

10. The device of claim 9 wherein the resistive switching material comprises a non-stoichiometric material comprising a plurality of defect sites.

11. The device of claim 9 wherein the resistive switching material comprises a non-stoichiometric silicon oxide comprising a plurality of defect sites.

12. The device of claim 11 wherein at least some of the metal particles from the active metal material are disposed within defect sites from the plurality of defect sites.

13. The device of claim 1 further comprising:
a plurality of CMOS devices disposed within the substrate, wherein the plurality of CMOS devices comprise control circuitry for the plurality of resistive switching devices.

14. A method for operating a semiconductor device comprising a substrate, a first plurality of electrodes disposed upon the substrate, wherein each electrode from the first plurality of electrodes comprises a metal containing material, a plurality of resistive switching devices disposed overlying the plurality of first electrodes, wherein each resistive switching device from the plurality of resistive switching devices comprises a first resistive switching material, a second resistive switching material, and at least an active metal material, wherein the first resistive switching material is disposed overlying the first electrode, wherein the second resistive switching material is disposed overlying and contacting the first resistive switching material, wherein the active metal material is disposed overlying the second resistive switching material, wherein the first resistive switching material is characterized by a first switching voltage having a first amplitude, wherein the second resistive switching material is characterized by a second switching voltage having a second amplitude, and wherein the first amplitude is less than the second amplitude, and a second plurality of electrodes disposed above the plurality of resistive switching devices, wherein each electrode from the second plurality of electrodes comprises the metal material, and wherein each electrode from the second plurality of electrodes is disposed overlying and electrically coupled to the active metal material of the resistive switching devices from the plurality of resistive switching devices comprising:
applying a first access voltage across a first electrode from the first plurality of electrodes and a first electrode from the second plurality of electrodes to there by apply the first access voltage across a resistive switching device from the plurality of resistive switching devices, wherein an amplitude of the first access voltage is greater than the first amplitude of the first switching voltage, wherein the amplitude of the first access voltage is less than the second amplitude of the second switching voltage to thereby cause first resistive switching material of the switching material stack to change from a high resistance state to a low resistant state;
determining a read current flowing across the first electrode from the first plurality of electrodes and the first electrode from the second plurality of electrodes; and
determining a state of the resistive switching device in response to the read current.

15. The method of claim 14 wherein a first plurality of resistive switching devices are coupled to the first electrode from the first plurality of electrodes; and
wherein a voltage having an amplitude greater than the first amplitude of the first switching voltage is inhibited from being applied to the first plurality of resistive switching devices other than the resistive switching device in response to the applying the first access voltage across the first electrode from the first plurality of electrodes and the first electrode from the second plurality of electrodes.

16. The method of claim 14 wherein a first plurality of resistive switching devices are coupled to the first electrode from the second plurality of electrodes; and
wherein a voltage having an amplitude greater than the first amplitude of the first switching voltage is inhibited from being applied to the first plurality of resistive switching devices other than the resistive switching device in response to the applying the first access voltage across the first electrode from the first plurality of electrodes and the first electrode from the second plurality of electrodes.

17. The method of claim 14 wherein a second resistive switching device is coupled to a second electrode from the first plurality of electrodes and a second electrode from the second plurality of electrodes;
and wherein a voltage having an amplitude greater than the first amplitude of the first switching voltage is inhibited from being applied to the second resistive switching device in response to the applying the first access voltage across the first electrode from the first plurality of electrodes and the first voltage from the second plurality of electrodes.

18. The method of claim 14 wherein the second resistive switching material is characterized by a third switching voltage having a third amplitude and associated with switching from the high resistance state to the low resistance state; and
wherein a voltage having an amplitude greater than the third amplitude of the third switching voltage is inhibited from being applied to the second resistive switching in response to the applying the first access voltage across the first electrode from the first plurality of electrodes and the first voltage from the second plurality of electrodes.

19. The method of claim 18 wherein the first switching voltage is positive;
wherein the third switching voltage is negative; and
wherein the first access voltage is positive.

20. The method of claim 14 wherein when applying the first access voltage across the resistive switching device, a conductive filament is formed in a first resistive switching material in the resistive switching device from the plurality of resistive switching devices.

21. The method of claim 14 wherein applying the first access voltage comprises
applying the first access voltage using a driver circuit disposed within the substrate.

* * * * *